(12) United States Patent
Wanlass et al.

(10) Patent No.: US 8,772,623 B2
(45) Date of Patent: Jul. 8, 2014

(54) LOW-BANDGAP, MONOLITHIC, MULTI-BANDGAP, OPTOELECTRONIC DEVICES

(71) Applicant: Alliance for Sustainable Energy, LLC, Golden, CO (US)

(72) Inventors: Mark W. Wanlass, Golden, CO (US); Jeffrey J. Carapella, Evergreen, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/664,142

(22) Filed: Oct. 30, 2012

(65) Prior Publication Data

US 2013/0112244 A1    May 9, 2013

Related U.S. Application Data

(62) Division of application No. 10/515,243, filed as application No. PCT/US02/16101 on May 21, 2002, now abandoned.

(51) Int. Cl.
*H01L 31/042* (2014.01)

(52) U.S. Cl.
USPC ........... 136/249; 136/255; 136/256; 136/261; 136/262; 438/37; 438/57; 438/93; 438/98; 438/745; 438/752; 438/753; 257/53; 257/184; 257/190; 257/191; 257/201

(58) Field of Classification Search
USPC ............ 136/249, 255, 256, 261, 262; 438/37, 438/57, 93, 98, 705, 718, 745, 752, 753; 257/53, 184, 190, 191, 200, 201
See application file for complete search history.

(56) References Cited

U.S. PATENT DOCUMENTS

| | | | |
|---|---|---|---|
| 3,900,868 | A | 8/1975 | Bock et al. |
| 4,214,946 | A | 7/1980 | Felsher et al. |
| 4,255,211 | A | 3/1981 | Fraas |
| 4,278,474 | A | 7/1981 | Blakeslee et al. |

(Continued)

FOREIGN PATENT DOCUMENTS

| | | |
|---|---|---|
| JP | 11-163380 | 6/1999 |
| JP | 2003-347582 | 12/2003 |

(Continued)

OTHER PUBLICATIONS

International Preliminary Report on Patentability for PCT/US2009/032480 mailed Nov. 25, 2010.

(Continued)

*Primary Examiner* — Golam Mowla
(74) *Attorney, Agent, or Firm* — John C. Stolpa

(57) ABSTRACT

Low bandgap, monolithic, multi-bandgap, optoelectronic devices (10), including PV converters, photodetectors, and LED's, have lattice-matched (LM), double-heterostructure (DH), low-bandgap GaInAs(P) subcells (22, 24) including those that are lattice-mismatched (LMM) to InP, grown on an InP substrate (26) by use of at least one graded lattice constant transition layer (20) of InAsP positioned somewhere between the InP substrate (26) and the LMM subcell(s) (22, 24). These devices are monofacial (10) or bifacial (80) and include monolithic, integrated, modules (MIMs) (190) with a plurality of voltage-matched subcell circuits (262, 264, 266, 270, 272) as well as other variations and embodiments.

23 Claims, 17 Drawing Sheets

(56) References Cited

U.S. PATENT DOCUMENTS

| | | | |
|---|---|---|---|
| 4,338,480 | A | 7/1982 | Antypas et al. |
| 4,881,979 | A * | 11/1989 | Lewis .................. 136/249 |
| 4,963,508 | A | 10/1990 | Umeno et al. |
| 4,963,949 | A | 10/1990 | Wanlass et al. |
| 5,019,177 | A | 5/1991 | Wanlass |
| 5,053,083 | A | 10/1991 | Sinton |
| 5,185,288 | A | 2/1993 | Cook et al. |
| 5,261,969 | A | 11/1993 | Stanbery |
| 5,322,572 | A | 6/1994 | Wanlass |
| 5,376,185 | A | 12/1994 | Wanlass |
| 5,407,491 | A | 4/1995 | Freundlich et al. |
| 5,479,032 | A | 12/1995 | Forrest et al. |
| 5,571,339 | A | 11/1996 | Ringel et al. |
| 5,716,459 | A | 2/1998 | Chang et al. |
| 5,853,497 | A | 12/1998 | Lillington et al. |
| 5,865,906 | A | 2/1999 | Ferguson et al. |
| 5,944,913 | A | 8/1999 | Hou et al. |
| 6,034,321 | A | 3/2000 | Jenkins |
| 6,107,562 | A | 8/2000 | Hashimoto et al. |
| 6,150,604 | A | 11/2000 | Freundlich et al. |
| 6,162,768 | A | 12/2000 | Coolbaugh et al. |
| 6,162,987 | A | 12/2000 | Murray et al. |
| 6,180,432 | B1 | 1/2001 | Freeouf |
| 6,218,607 | B1 | 4/2001 | Mulligan et al. |
| 6,239,354 | B1 | 5/2001 | Wanlass |
| 6,252,287 | B1 | 6/2001 | Kurtz et al. |
| 6,255,580 | B1 | 7/2001 | Karam et al. |
| 6,265,653 | B1 | 7/2001 | Haigh et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,313,715 | B1 | 11/2001 | King et al. |
| 6,340,788 | B1 | 1/2002 | King et al. |
| 6,420,732 | B1 | 7/2002 | Kung et al. |
| 6,482,672 | B1 | 11/2002 | Hoffman et al. |
| 6,660,928 | B1 | 12/2003 | Patton et al. |
| 6,680,432 | B2 | 1/2004 | Sharps et al. |
| 6,743,974 | B2 | 6/2004 | Wada et al. |
| 6,815,736 | B2 | 11/2004 | Mascarenhas |
| 6,917,061 | B2 | 7/2005 | Pan et al. |
| 6,951,819 | B2 | 10/2005 | Iles et al. |
| 7,095,050 | B2 | 8/2006 | Wanlass et al. |
| 7,309,832 | B2 | 12/2007 | Friedman et al. |
| 7,488,890 | B2 | 2/2009 | Takamoto et al. |
| 7,675,077 | B2 | 3/2010 | Shei et al. |
| 8,067,687 | B2 | 11/2011 | Wanless |
| 8,173,891 | B2 | 5/2012 | Wanlass et al. |
| 2002/0062858 | A1 | 5/2002 | Mowles |
| 2003/0015700 | A1 | 1/2003 | Eisenbeiser et al. |
| 2003/0160251 | A1 | 8/2003 | Wanlass et al. |
| 2004/0166681 | A1 | 8/2004 | Iles et al. |
| 2004/0206389 | A1 | 10/2004 | Takamoto et al. |
| 2005/0274411 | A1 | 12/2005 | King et al. |
| 2006/0112986 | A1 | 6/2006 | Atwater, Jr. et al. |
| 2006/0162768 | A1 | 7/2006 | Wanlass et al. |
| 2006/0185582 | A1 | 8/2006 | Atwater, Jr. et al. |
| 2007/0151595 | A1 | 7/2007 | Chiou et al. |
| 2007/0277869 | A1 | 12/2007 | Shan et al. |
| 2008/0149915 | A1 | 6/2008 | Mori et al. |
| 2008/0200020 | A1 | 8/2008 | Krull et al. |
| 2009/0078308 | A1 | 3/2009 | Varghese et al. |
| 2009/0229659 | A1 | 9/2009 | Wanlass et al. |
| 2009/0288703 | A1 | 11/2009 | Stan et al. |

FOREIGN PATENT DOCUMENTS

| | | |
|---|---|---|
| WO | 03100868 | 12/2003 |
| WO | 2004017425 | 2/2004 |
| WO | 2004022820 | 3/2004 |

OTHER PUBLICATIONS

Aiken, "Anti-reflection coating design for series interconnected multi-junction solar cells", Progress Photovoltaics: Research Applications, Nov./Dec. 2000, vol. 8, No. 6, pp. 563-570.

Aiken, "High performance anti-reflection coatings for broadband multi-junction solar cells," Solar Energy Materials & Solar Cells, Nov. 2000, vol. 64, No. 4, pp. 393-404.

Lamorte, et al., "Computer Modeling of a Two-junction, Monolithic Cascade Solar Cell," IEEE Transactions on Electron Devices, Jan. 1980, vol. 27, Issue 1, pp. 231-249.

Wanlass, et al., "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), Jun. 14-16, 2004, pp. 462-470.

Wanlass, et al., "Lattice-Mismatched Approaches for High Performance, III-V Photovoltaic Energy Converters", 31st IEEE Photovoltaics Specialists Conference and Exhibition, Feb. 2005, pp. 1-6.

Wehrer, et al., "0.74/0.55-eV $Ga_xIn_{1-x}As/InAsyP_{1-y}$ Monolithic, Tandem, MIM TPV Converters: Design, Growth, Processing and Performance," Proc. 29th IEEE Photovoltaic Spec. Conf., May 2002, pp. 884-887, New Orleans, LA.

Yablonovich, et al., "Extreme selectivity in the lift-off of epitaxial GaAs films", Applied Physics Letters, Dec. 28, 1987, vol. 51, No. 26, pp. 2222-2224.

Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.

International Search Report for International (PCT) Application No. PCT/US02/16101, mailed Sep. 6, 2002.

Written Opinion for International (PCT) Application No. PCT/US02/16101, mailed Apr. 6, 2004.

International Preliminary Examination Report for International (PCT) Application No. PCT/US02/16101, mailed Aug. 30, 2004.

Sinharoy et al., "Progress in the Development of Metamorphic Multi-junction III-V Space Solar Cells," Prog. Photovolt: Res. Appl., vol. 10, No. 6, Sep. 2002, pp. 427-432.

Venkatasubramanian et al., "An Inverted-Growth Approach to Development of an IR-Transparent, High-Efficiency AlGaAs/GaAs Cascade Solar Cell," Conf. Record of the 22nd IEEE Phtovoltaic Specialists Conference, Oct. 7-11, 1991, pp. 93-98.

Written Opinion of the International Search Authority for PCT/US2009/032480 mailed Jul. 30, 2009.

International Search Report for PCT/US2009/032480 dated Jul. 30, 2009.

U.S. Appl. No. 10/515,243 Restriction Requirement dated Jun. 25, 2008.

U.S. Appl. No. 10/515,243 Non-Final Office Action dated Jun. 18, 2009.

U.S. Appl. No. 10/515,243 Non-Final Office Action dated Nov. 24, 2010.

U.S. Appl. No. 10/515,243 Final Office Action dated Mar. 4, 2010.

U.S. Appl. No. 10/515,243 Restriction Requirement dated Oct. 20, 2008.

U.S. Appl. No. 10/515,243 Restriction Requirement dated Feb. 2, 2009.

Liu et al., "Electrochemical performance of $\alpha$-Fe2O3 nanorods as anode material for lithium-ion cells," Electrochimica Acta, vol. 54, Issue 6, Feb. 2009, pp. 1733-1736.

* cited by examiner

LOW-BANDGAP, MONOLITHIC, MULTI-BANDGAP, OPTOELECTRONIC DEVICES

CROSS REFERENCE TO RELATED APPLICATIONS

This Application is a Divisional Application of, and claims benefit and priority to U.S. application Ser. No. 10/515,243, entitled "Low Bandgap, Monolithic, Multi-Bandgap, Optoelectronic Devices" filed Nov. 19, 2004, which is a 371 Application of PCT/US02/16101, entitled "Low-Bandgap, Monolithic, Multi-Bandgap, Optoelectronic Devices" filed May 21, 2002, both of which are hereby incorporated by reference in their entirety.

GOVERNMENT LICENSE RIGHTS

The United States Government has rights in this invention under Contract No. DE-AC36-99GO10337 between the United States Department of Energy and the National Renewable Energy Laboratory, a Division of the Midwest Research Institute.

TECHNICAL FIELD

This application relates to optoelectronic devices, and, more specifically, to low bandgap, monolithic, multi-bandgap solar photovoltaic (SPV) and thermophotovoltaic (TPV) cells for converting solar and/or thermal energy to electricity as well as for related photodetector devices for detecting light signals and light emitting diode (LED) devices for converting electricity to light and/or infrared (IR) radiant energy.

BACKGROUND

It is well known that the most efficient conversion of radiant energy to electrical energy with the least thermalization loss in semiconductor materials is accomplished by matching the photon energy of the incident radiation to the amount of energy needed to excite electrons in the semiconductor material to transcend the bandgap from the valence band to the conduction band. However, since solar radiation and blackbody radiation usually comprise a wide range of wavelengths, use of only one semiconductor material with one bandgap to absorb such radiant energy and convert it to electrical energy will result in large inefficiencies and energy losses to unwanted heat.

Ideally, there would be a semiconductor material with a bandgap to match the photon energy for every wavelength in the radiation. That kind of device is impractical, if not impossible, but persons skilled in the art are building monolithic stacks of different semiconductor materials into devices commonly called tandem converters and/or monolithic, multi-bandgap or multi-bandgap converters, to get two, three, four, or more bandgaps to match more closely to different wavelengths of radiation and, thereby, achieve more efficient conversion of radiant energy to electrical energy. Essentially, the radiation is directed first into a high bandgap semiconductor material, which absorbs the shorter wavelength, higher energy portions of the incident radiation and which is substantially transparent to longer wavelength, lower energy, portions of the incident radiation. Therefore, the higher energy portions of the radiant energy are converted to electric energy by the larger bandgap semiconductor materials without excessive thermalization and loss of energy in the form of heat, while the longer wavelength, lower energy portions of the radiation are transmitted to one or more subsequent semiconductor materials with smaller bandgaps for further selective absorption and conversion of remaining radiation to electrical energy.

Semiconductor compounds and alloys with bandgaps in the various desired energy ranges are known, but that knowledge alone does not solve the problem of making an efficient and useful energy conversion device. Defects in crystalline semiconductor materials, such as impurities, dislocations, and fractures provide unwanted recombination sites for photogenerated electron-hole pairs, resulting in decreased energy conversion efficiency. Therefore, high-performance, photovoltaic conversion cells comprising semiconductor materials with the desired bandgaps, often require high quality, epitaxially grown crystals with few, if any, defects. Growing the various structural layers of semiconductor materials required for a multi-bandgap, tandem, photovoltaic (PV) conversion device in a monolithic form is the most elegant, and possibly the most cost-effective, approach.

Epitaxial crystal growth of the various compound or alloy semiconductor layers with desired bandgaps is most successful, when all of the materials are lattice-matched (LM), so that semiconductor materials with larger crystal lattice constants are not interfaced with other materials that have smaller lattice constants or vice versa. Lattice-mismatching (LMM) in adjacent crystal materials causes lattice strain, which, when high enough, is usually manifested in dislocations, fractures, wafer bowing, and other problems that degrade or destroy electrical characteristics and capabilities of the device. Unfortunately, the semiconductor materials that have the desired bandgaps for absorption and conversion of radiant energy in some energy or wavelength bands do not always lattice match other semiconductor materials with other desired bandgaps for absorption and conversion of radiant energy in other energy or wavelength bands. Therefore, fabrication of device quality, multi-bandgap, monolithic, converter structures is difficult, if not impossible, for some portions of the radiation frequency or wavelength spectrum.

This problem has been particularly difficult to solve in the infrared (IR) portion of the spectrum, where options for suitable, commercially available substrates on which to grow thin films with the necessary bandgaps for absorption and conversion of the infrared radiation to electrical energy are very limited, and where compatible, i.e., lattice-matched, semiconductor materials with the different bandgaps needed to absorb and convert different portions of the infrared spectrum efficiently are also quite limited.

For example, the group III-V family of semiconductor alloys include some of the best materials for fabricating photovoltaic converters with bandgaps in a range of about 0.35 eV to 1.65 eV to absorb and convert infrared (IR) radiation with wavelengths in a range of about 3.54 µm to 0.75 µm. Group III-V alloys comprise combinations of binary compounds formed from Groups III and V of the Periodic Table. These binary compounds can be alloyed together into various ternary or quaternary compositions to obtain any desired bandgap in the range of 0.35 eV to 1.65 eV. These alloys also have direct bandgaps (i.e., no change in momentum is required for an electron to cross the bandgap between the valance band and the conduction band), which facilitate efficient absorption and conversion of radiant energy to electricity. However, InP, which has a lattice constant of 5.869 Å (sometimes rounded to 5.87 Å) and a bandgap of 1.35 eV, is one of only a few feasible, commercially available substrate materials with a lattice constant even close to those lower bandgap Group III-V alloys i.e., InP-based or related ternary and quaternary compounds. The lowest bandgap Group III-V alloy that can be lattice-matched to the 5.869 Å lattice constant of an InP substrate is $Ga_{0.47}In_{0.53}As$, which has a bandgap of about 0.74 eV, which leaves a significant range of lower frequency, longer wavelength (>1.67 μm), infrared (IR) radiation that cannot be absorbed and converted to electricity in monolithic converters in which the semiconductor absorption materials are lattice-matched to the substrate.

While the current unavailability of efficient and cost-effective solar photovoltaic (SPV) converters, especially multi-bandgap, monolithic, converter devices, capable of absorbing and converting infrared (IR) radiation in wavelengths greater than 1.67 μm leaves substantial amounts of energy in the solar spectrum to remain unconverted to electricity, in state-of-the-art SPV's, it is an even greater problem for thermophotovoltaic (TPV) devices Infrared (IR) radiation of wavelengths greater than 1.67 μm comprises a substantial amount of the energy radiated from blackbodies, and thermophotovoltaic (TPV) converters are intended to absorb and convert as much radiant energy from blackbodies to electric power as possible. Therefore, solutions to these problems, especially if such solutions could enable fabrication of monolithic converters with multiple bandgaps in infrared (IR) energy ranges, they would facilitate capture of more electric energy from solar and/or blackbody radiation.

U.S. Pat. No. 5,479,032 issued to S. Forrest et al., teaches that one or more ternary $In_xGa_{1-x}As$ alloys with x>0.53, i.3., with band-gaps less than 0.75 eV, can be grown epitaxially on an InP substrate by using intervening, graded layers of $InAs_yP_{1-y}$ between the InP substrate and the $In_xGa_{1-x}P$ (x>0.53) layers. However, those Forrest et al., patent teachings, which were directed to pixel detection of near infrared radiation incident on a focal plane for telecommunications applications, are not useful in SPV and TPV applications.

SUMMARY

Accordingly, a general object of the present disclosure is to provide a monolithic, multi-bandgap, photovoltaic converter for absorbing and converting infrared (IR) radiation of multiple wavelengths to electricity.

A more specific object of this disclosure is to provide a photovoltaic converter with at least one bandgap less than 0.74 eV to absorb infrared radiation in wavelengths longer than 1.67 μm and convert it to electricity.

An even more specific object of this disclosure is to provide a electric device quality, multi-bandgap, monolithic, photovoltaic converter that has at least one lattice-matched (LM), double-heterostructure (DH) with a bandgap less than 0.74 eV to absorb infrared (IR) energy in wavelengths longer than 1.67 μm and convert it to electricity.

Another specific object of the disclosure is to provide a device quality, multi-bandgap, monolithic, photovoltaic device with at least one lattice-matched (LM), double-heterostructure (DH) with a bandgap less than 0.74 eV, which is not lattice-matched to an InP substrate, but including a lattice constant transition layer or layers, which is transparent to infrared radiation wavelengths longer than about 1.67 μm, positioned somewhere between such lattice-matched (LM), double-heterostructure (DH) and the InP substrate.

Still another object of this disclosure is to provide a lattice constant transition layer or layers, which is transparent to infrared (IR) radiation wavelengths longer than about 1.67 μm, positioned between two subcells in a multi-bandgap, monolithic device, where the two subcells are not lattice-matched to each other and at least one of the subcells has a bandgap, which is less than the bandgap of the other subcell and is less than 0.74 eV.

Another object of the present disclosure is to provide one or more subcells with bandgaps less than 0.74 eV on an InP substrate.

Another object of the present disclosure is to provide a bifacial, monolithic, integrated, module (MIM) comprising multiple subcells, at least one subcell of which absorbs and converts radiation wavelengths less than 0.92 μm to electricity.

Another object of the present disclosure is to provide a bifacial, monolithic, integrated, module (MIM) comprising multiple subcells, at least one subcell of which absorbs and converts radiation wavelengths less than 1.67 μm to electricity.

Another specific object of this disclosure is to provide a method of voltage-matching a plurality of subcell circuits that have subcells with different bandgaps less than or equal to 1.35 eV.

Additional objects, advantages, and novel features of the disclosure are set forth in part in the description that follows and will become apparent to those skilled in the art upon examination of the following description and figures or may be learned by practicing the embodiments described herein. Further, the objects and the advantages of the embodiments described herein may be realized and attained by means of the instrumentalities and in combinations particularly pointed out in the appended claims.

To achieve the foregoing and other objects and in accordance with the purposes of the a present disclosure, as embodied and broadly described herein, a method of one embodiment described herein may comprise growing one or more subcell(s) that has a lattice constant greater than 5.869 Å, either alone or in combination with other subcells, on an InP substrate by using a lattice constant transition material between the InP substrate and the subcell(s) that have the lattice constants greater than 6.869 Å. The lattice constant transition material can be $InAs_yP_{1-y}$, where y is graded either continuously or in discrete stepped increments from one (1) to a value at which the $InAs_yP_{1-y}$ has a lattice constant that matches the lattice constant of at least one of the subcells with a lattice constant greater than 5.869 Å. The subcell bandgap is lower than the bandgap of the InP substrate and lower than the bandgap of the $InAs_yP_{1-y}$ lattice constant transition material. Additional subcells with even lower bandgaps can also be added, and, if any of such additional subcells has an even greater lattice constant that cannot be matched to the first subcell, then one or more additional lattice constant transition layers can also be added. All of the subcells can be grown on only one side of the substrate (monofacial) or one or more subcells can be grown on the front side of the substrate while one or more other subcells can be grown on the back side (bifacial), using whatever lattice constant transition layers are necessary to accommodate the subcell(s) on each side of the substrate.

Isolation layers can be used between subcells for independent electrical connection of the subcells, although, in bifacial embodiments, the substrate can be insulating or semi-insulating to serve as an isolation layer. Alternately, tunnel junctions can be used for intra-cell current flow between subcells. Either the monofacial or bifacial subcell structures can be made in monolithic, integrated, modules (MIMs), which are particularly useful for voltage-matching a plurality of such subcells, although the bifacial embodiments are particularly suitable for such MIM structures and voltage matching. On the other hand, the monofacial embodiments are particularly useful in ultra-thin devices in which the substrate is removed.

To achieve the foregoing and other objects and in accordance with the purposes of the various embodiments broadly described herein, embodiments may also comprise a monolithic, multi-bandgap, photovoltaic converter that has a first subcell comprising GaInAs(P) with a first bandgap and a first lattice constant, a second subcell comprising GaInAs(P) with a second bandgap and a second lattice constant, wherein the second bandgap is less than the first bandgap and the second lattice constant is greater than the first lattice constant, and further, wherein the second lattice constant is equal to a lattice constant of a $InAs_yP_{1-y}$ alloy with a bandgap greater than the first bandgap, and a lattice constant transition material positioned between the first subcell and the second subcell, said lattice constant transition material comprising $InAs_yP_{1-y}$ alloy with a lattice constant that changes gradually from the first lattice constant to the second lattice constant.

In one embodiment, the first subcell is a lattice-matched, double-heterostructure, comprising homojunction layers of GaInAs(P) clad by $InAs_yP_{1-y}$ cladding layers wherein the $InAs_yP_{1-y}$ cladding has a value for y in a range of $0 \leq y < 1$, such the $InAs_yP_{1-y}$ cladding layers of the first subcell have a lattice constant equal to the first lattice constant. The second subcell may be a lattice-matched, double-heterostructure comprising homojunction layers of GaInAs(P) clad by $InAs_yP_{1-y}$ cladding layers, wherein the $InAs_yP_{1-y}$ cladding has a value for y in a range of $0 \leq y < 1$, such that the $InAs_yP_{1-y}$ cladding layer of the second subcell have a lattice constant equal to the second lattice constant. Either a tunnel junction or an isolation layer is also positioned between subcells. The InP substrate can be doped with deep acceptor atoms to make the substrate more electrically insulating, and, in bifacial structures, this feature allows the substrate to serve as an electrical isolation between subcells positioned on opposite sides of the substrate.

A plurality of the monolithic, multi-bandgap, photovoltaic converters can also be grown on a common substrate in a monolithic, integrated, module (MIM), comprising the plurality of monolithic, multi-bandgap, photovoltaic converters, each of which comprises: (i) a first subcell with a first bandgap and a first lattice constant; (ii) a second subcell with a second bandgap and a second lattice constant, wherein the second bandgap is less than the first bandgap and the second lattice constant is greater than the first lattice constant; and (iii) a lattice constant transition material positioned between the first subcell and the second subcell, said lattice constant transition material having a bandgap at least as large as the first bandgap and a lattice constant that changes from the first lattice constant to the second lattice constant. Either monofacial structures or bifacial structures can be grown in MIM configurations, but the bifacial structure is particularly suited to MIM applications. The subcells in MIM structures can be isolated for independent electrical connection, or tunnel junctions can be provided. Isolated, independently connected, subcells are particularly adapted for voltage-matching in MIM structures. There can be more subcell stacks on one side of the substrate than the other to facilitate such voltage-matching, where the subcells on one side of the substrate are lower bandgap than subcell on the other side of the substrate.

The substrates can also be removed to provide ultra-thin photovoltaic devices.

BRIEF DESCRIPTION OF THE DRAWINGS

The accompanying drawings, which are incorporated in and form a part of the specification, illustrate a plurality of embodiments of the present disclosure, and together with the descriptions serve to explain the principles of the present disclosure. In the drawings.

DETAILED DESCRIPTION

Figure 1:
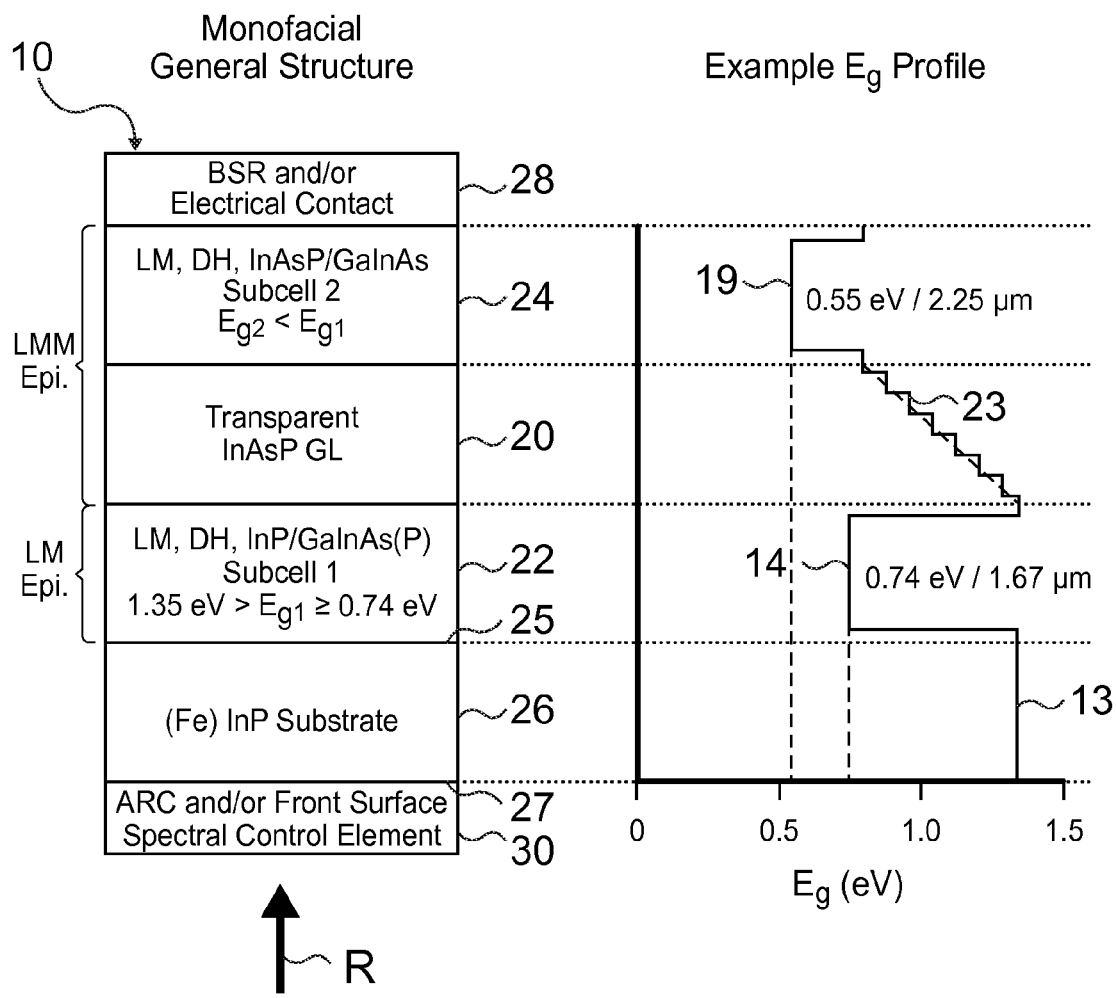
FIG. 1 is a diagrammatic illustration of the general, significant components of a monofacial, inverted, multi-bandgap, monolithic, photovoltaic device with two lattice-matched (LM), double-heterostructure (DH) subcells grown on an InP substrate and series connected, wherein the second subcell, which has a bandgap that is less than the bandgap of the first subcell and is less than about 0.74 eV, is lattice-mismatched (LMM) to the InP substrate, but is grown on a transparent, lattice constant transition layer positioned between the two subcells to accommodate the lattice mismatch.
Figure 2:
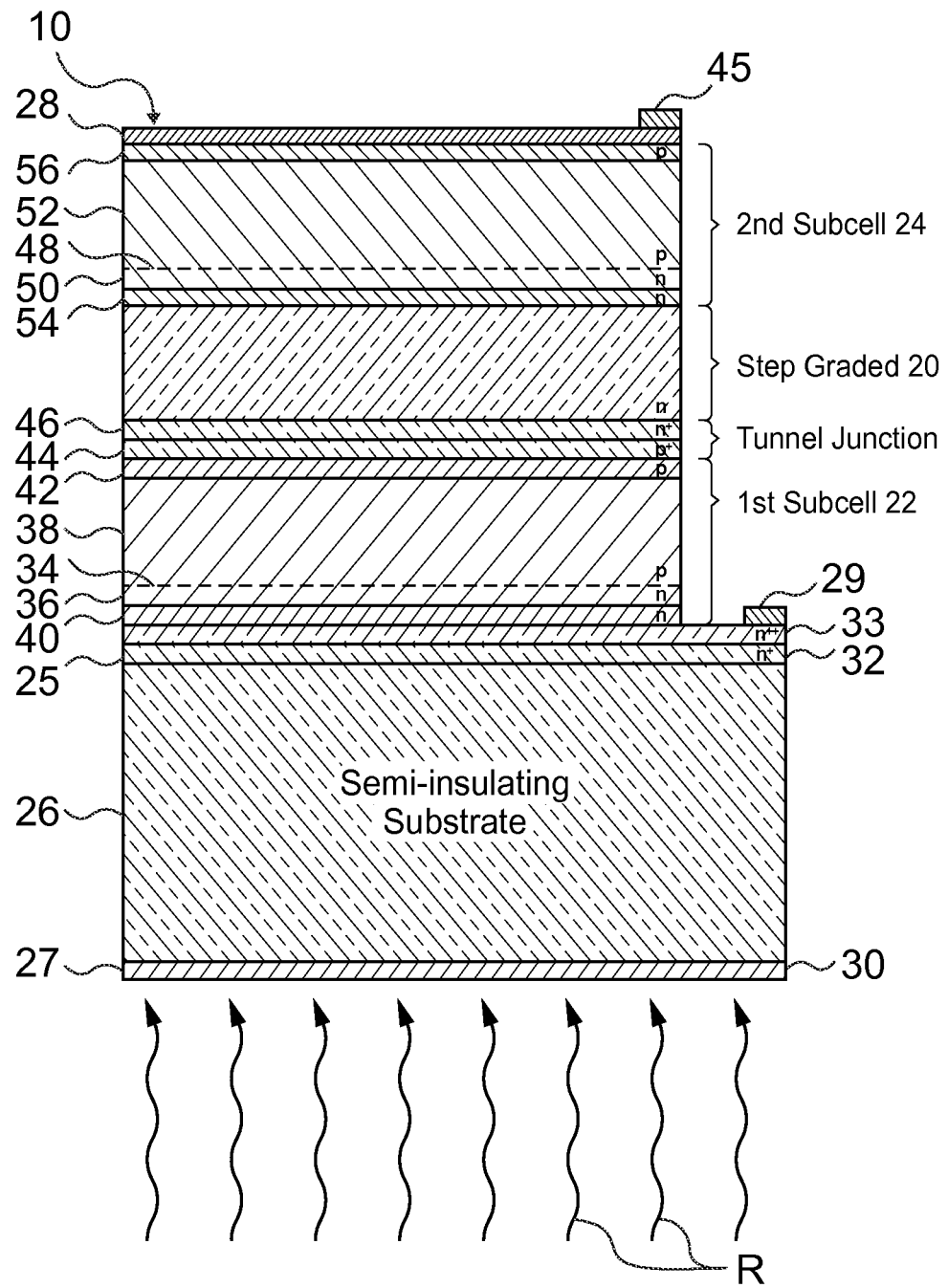
FIG. 2 is a more detailed cross-sectional view of the device of FIG. 1 showing some of the auxiliary structures and components useful in an embodiment of the device.

A schematic diagram of principle components of a monofacial embodiment of a low-bandgap, monolithic, multi-bandgap (tandem) photovoltaic (PV) converter 10 according to one embodiment is shown in FIG. 1 juxtaposed to a corresponding bandgap energy ($E_g$) profile. The diagram in FIG. 1 illustrates a cross-section of the PV converter 10 profile in a manner that is conventional in the industry, i.e., not necessarily in proportion to actual sizes, because actual layer thicknesses are too small to illustrate in actual proportions. Additional structural components used to fabricate an example of the PV converter 10 of FIG. 1 are illustrated in FIG. 2, which will be described in more detail below.

In the monofacial embodiment or approach illustrated in FIG. 1, all of the subcells, for example, subcells 22, 24 in FIG. 1, are grown epitaxially on only one side or face 25 of a substrate 26. Bifacial embodiments or approaches (not shown in FIG. 1), in which subcells are grown epitaxially on opposite sides or faces of a substrate, will be illustrated in other figures and described below.

Figure 3:
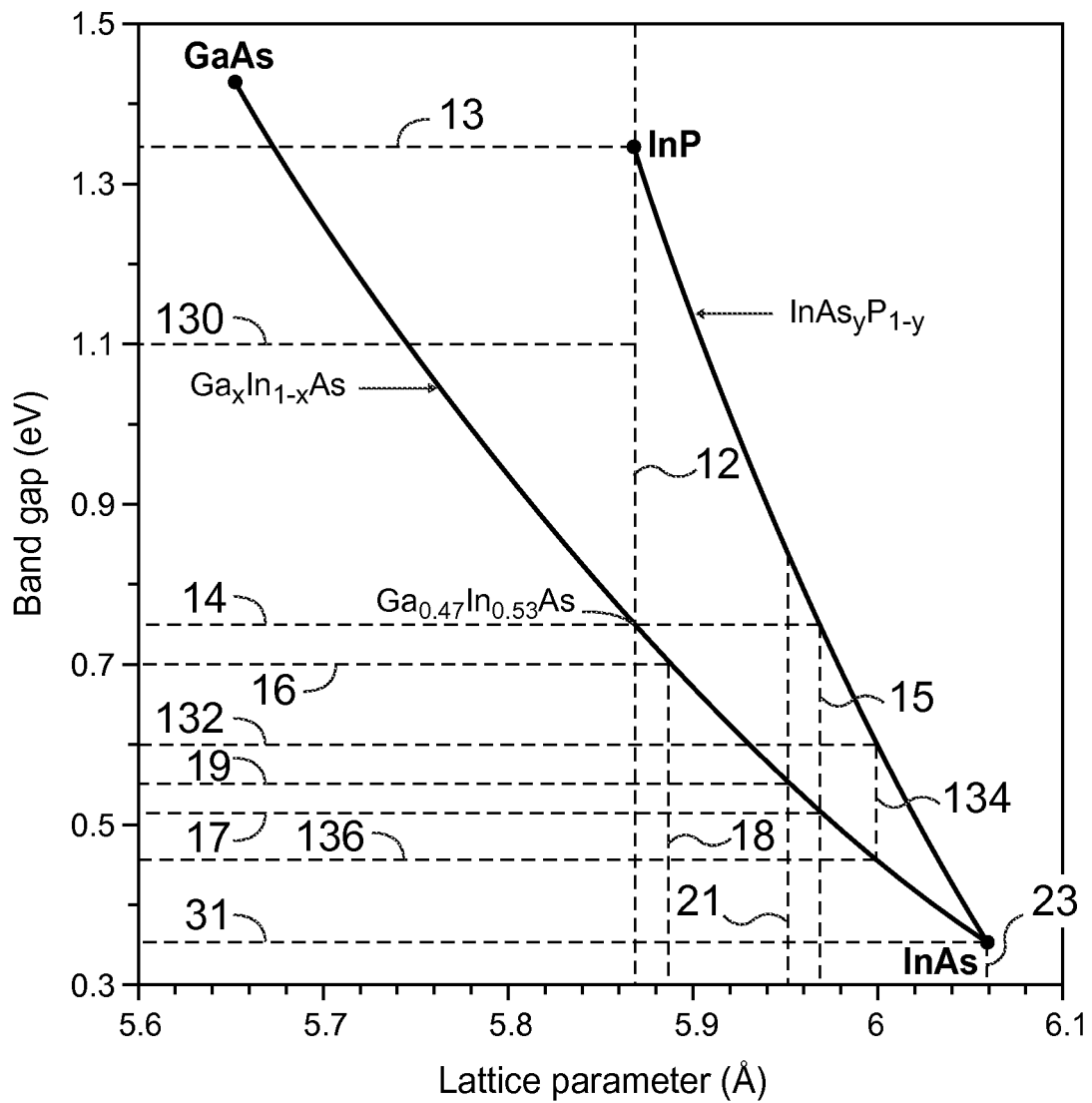
FIG. 3 is a bandgap versus lattice parameter chart showing bandgap and lattice constant parameters of semiconductor materials used as examples in the embodiments of FIGS. 1 and 2.

The monofacial PV converter 10 illustrated in FIG. 1 is designed with low bandgap, Group III-V semiconductor alloy materials, especially for bandgaps below about 0.74 eV, where ternary GaInAs or AlInAs and quaternary (GaInAsP or AlGaInAs semiconductor alloys do not match the crystal lattice constant of InP substrates 26. A quick reference to the lattice parameter versus bandgap chart in FIG. 3 shows that the crystal lattice constant of InP is about 5.87 Å, as indicated by broken line 12, while the lowest possible bandgap for a Group III-V alloy with that same lattice constant of 5.87 Å is about 0.74 eV, which is provided by the ternary alloy $Ga_{0.47}In_{0.53}As$, as indicated by the broken line 14. Lattice-matched (LM) materials refers to materials with lattice constants that are either equal or similar enough that when the materials are grown expitaxially, one or the other adjacent each other in a single crystal, any difference in size of crystalline structures of the respective materials is resolved substantially by elastic deformation and not by inelastic relaxation, separation, dislocations, or other undesirable inelastic effects. A lattice-mismatch (LMM) is generally considered to occur when a second crystalline material being grown on a first crystalline material has a lattice constant that is not equal to the lattice constant of the first material and is not lattice-matched as described above. (The terms "lattice parameter" and "lattice constant" mean substantially the same thing and are often used interchangeably in the art and in this description.) Therefore, as shown by broken lines 16, 18 in FIG. 3, any Group III-V alloy with a bandgap less than about 0.74 eV will be a lattice-mismatched (LMM) with an InP substrate. Since a significant feature of this disclosure is to provide a monolithic, multi-bandgap, photovoltaic (PV) converter with at least one bandgap less than about 0.74 eV, such a lattice-mismatch has to be mitigated in order to avoid the adverse manifestations of lattice strain and stresses caused by such lattice-mismatch, such as dislocations, fractures, wafer bowing, rough surface morphologies, and the like.

Referring again to the exemplary monofacial, monolithic, multi-bandgap, photovoltaic (PV) converter 10 illustrated in FIG. 1, such mitigation of lattice-mismatch between a first Group III-V semiconductor subcell 22 and a second Group III-V semiconductor subcell 24 with a different bandgap below about 0.74 eV is provided by a lattice constant transition layer 20 that: (i) has graded (either distinctly stepped increments or continuously increasing) lattice constants, which span the difference between the respective lattice constants of the first and second subcells 22, 24; and (ii) is transparent to infrared wavelengths longer than those absorbed by the first subcell 22. While a transparent lattice constant transition layer 20, which is graded to have lattice constants that vary continuously from the lattice constant of the first subcell 22 to the lattice constant of the second subcell 24, is satisfactory for this purpose, a transparent lattice constant transition layer 20 comprising, discrete or stepped changes in lattice constants might be preferable. Dislocations in semiconductor crystals are undesirable, because they facilitate recombination of charge carriers (electron hole pairs), which is deleterious to the electrical performance of a semiconductor device.

In one embodiment, a lattice constant transition layer 20 is a ternary $InAs_yP_{1-y}$ material in which the proportion of As is gradually increased, either continuously or in discrete increments as will be discussed in more detail below. One significant feature is that the $InAs_yP_{1-y}$ lattice constant transition layer 20 is transparent to infrared (IR) radiation wavelengths longer than those absorbed by the ternary $Ga_xIn_{1-x}As$ or optional quaternary $Ga_xIn_{1-x}As_yP_{1-y}$ in the first subcell 22, so there is virtually no loss of energy, or production of heat, in the lattice constant transition layer 20.

The monofacial, monolithic, multi-bandgap, photovoltaic (PV) converter 10 illustrated in FIG. 1 has an inverted structure with the active subcell layers 22, 24, transparent lattice constant transition layer 20, and optional other layers (shown in FIG. 2, which will be described in more detail below), grown epitaxially on one side 25 of a substrate 26. This structure is called inverted, because the radiation energy R enters the converter 10 through the substrate 26, so it has to be transmitted through the substrate 26 before being absorbed and converted to electricity by the subcells 22, 24. Therefore, as will be explained in more detail below, the substrate 26 has to be transparent to all the incident radiation R so that none of the incident radiation R is absorbed and thermalized or lost as heat before it reaches the subcells 22, 24, where it can be converted to electricity. Likewise, the incident radiation R transmitted by the substrate 26 should encounter the subcell 22 with the highest bandgap before it encounters the subcell 24 with the lowest bandgap, because higher bandgap subcells will absorb only the higher energy radiation (higher frequency and shorter wavelength) and convert it to electricity while transmitting unabsorbed, lower energy radiation (lower frequency and longer wavelength). Therefore, any of the remaining lower energy incident radiation R that is not absorbed and converted to electricity by the higher bandgap, first subcell 22 will be transmitted to the lower bandgap, second subcell 24, where at least some, if not all, of it can be absorbed and converted to electricity. The amount of the remaining, lower energy, incident radiation that can be absorbed and converted to electricity by the second subcell 24 will depend on the particular bandgap of the subcell 24 and the particular radiation wavelengths in such remaining, lower energy, incident radiation. Of course, the lattice constant transition layer 20 has to be transparent to, and not absorptive of, the remaining, lower energy, incident radiation that is not absorbed by the first subcell 22 so that all of such remaining, lower energy, incident radiation can reach the second subcell 24. Further, as will be explained in more detail below, additional subcells with different bandgaps can also be included in order to optimize absorption and conversion of various incident radiation energy levels or bands to electricity.

The back-surface reflector (BSR) or other spectral control element 28, which can also function as an electrode contact or lateral current flow element, is deposited on the second subcell 24, as will be described in more detail below. A spectral control layer 30 would usually be deposited on the front side 27 of the substrate 26 either to minimize reflection of incident radiation R, e.g., an anti-reflective coating (ARC), as is well-known to persons skilled in the art, especially for SPV converter applications, or to reflect all incident radiation R with wavelengths lower than those absorbable by the lowest bandgap subcell 24, especially for the TPV converter applications used for generating electricity and not heat. These structures and functions will be discussed in more detail below. The terms front and back, as used in this description, relate to the direction in which incident radiation propagates into and through a device or layers in a device. Therefore, radiation is incident first on the front of a device or layer and propagates toward the back of the device or layer.

In converter 10, substrate 26 comprises InP, because, as explained above: (i) InP has a lattice constant (5.87 Å), which is one of a few commercially available bulk, single crystal materials that are close to the lattice constants of Group III-V alloys that have bandgaps less than 0.74 eV (for absorbing infrared radiation wavelengths longer than about 1.67 µm); (ii) InP has a bandgap of about 1.35 eV (see FIGS. 1 and 3), thus does not absorb, and is transparent to, infrared radiation wavelengths longer than 0.93 µm; (iii) InP can be doped to be highly resistive and thereby function as an insulator or semi-insulator, as described in more detail below; (iv) Lattice-mismatch between InP and $InAs_yP_{1-y}$ or GaInAs(P) materials, which have lower bandgaps than InP and are used extensively in this disclosure as explained below, is in compression rather than tension, so lattice-mismatched $InAs_yP_{1-y}$ or GaInAs(P) grown on InP are not so likely to develop fissures or crack; and (v) Bulk InP crystals are less expensive than InAs and GaSb. Therefore, the InP substrate 26 is suitable in a monofacial, inverted PV converter 10 structure for any application in which the incident radiation R to be converted to electric energy has 0.93 µm and longer wavelengths, such as thermophotovoltaic (TPV) cells and some solar photovoltaic (SPV) cells as well as infrared detector devices and multi-bandgap infrared (IR) LED's. However, InP is susceptible to free carrier absorption of energy, which results in energy being lost in the form of heat. To minimize or prevent such free carrier absorption of energy, the InP substrate can be doped with deep acceptor atoms, such as iron (Fe) or chromium (Cr), to pin the Fermi level deeply within the bandgap, which makes the InP act more like an insulator or semi-insulator.

Subject to accommodations for a contact, buffer, cladding, optical control elements, and/or other auxiliary layers (not shown in FIG. 1), which will be described in more detail below, the first subcell 22 is deposited on substrate 26 with a bandgap $E_{g1}$ designed to absorb the first desired wavelength or frequency band of the incident radiation R and convert such absorbed radiation to electricity. In one embodiment, this first subcell 22 is a lattice-matched (LM), double-heterostructure (DH), $InP/Ga_xIn_{1-x}As$ or $InP/Ga_xIn_{1-x}As_yP_{1-y}$ with a desired bandgap $E_{g1}$, somewhere in a range that is less than the 1.35 eV bandgap of the InP substrate 26. This first subcell 22 in FIG. 1 may be grown epitaxially and is lattice-matched to the InP substrate 26. Please note that "lattice-matched" when used in the context of a "lattice-matched, double-heterostructure" for a subcell generally means that the semiconductor materials within the subcell itself are lattice-matched to each other. Therefore, a subcell can be a lattice-matched, double-heterostructure, while such subcell may or may not be lattice-matched to a substrate or to another layer or material in the device that is not part of the subcell.

In one embodiment, subcell 22 lattice-matched to the InP substrate 26 comprises $InP/Ga_{0.47}In_{0.53}As$ with a bandgap of about 0.74 eV, because, as shown by the lines 12, 14 in FIG. 3, $Ga_{0.47}In_{0.53}As$ is the lowest bandgap Group III-V alloy that has the same lattice constant as the InP substrate 26. Therefore, a $InAs_yP_{1-y}$ lattice constant transition layer 20 can make a transition from the lattice constant of InP (about 5.87 Å) to a lattice constant matching a $Ga_xIn_{1-x}As$ alloy with a bandgap as low as about 0.52 eV, i.e., to a lattice constant as high as about 5.968 Å (see lines 15, 17 in FIG. 3), and still be transparent to all infrared wavelengths that are longer than those absorbed by the 0.74 eV bandgap of the first subcell 22 (see line 14 in FIG. 3). Of course, the desired bandgap for the second subcell 24 could also be anywhere between 0.74 eV and 0.52 eV, in which case the $InAs_yP_{1-y}$ lattice constant transition layer 20 can be formulated to provide a back surface with whatever lattice constant is needed on which to grow the desired $Ga_xIn_{1-x}As_yP_{1-y}$ that has such a desired bandgap.

An example second subcell 24 for use in conjunction with a first subcell 22 described above, therefore, can be a quaternary $Ga_xIn_{1-x}As_yP_{1-y}$ or a ternary $Ga_xIn_{1-x}As$ with a bandgap as low as 0.52 eV. In one embodiment, an example second cell 24 comprises a lattice-matched, double-heterostructure $InAs_yP_{1-y}/Ga_xIn_{1-x}As$ with a bandgap 19 of 0.55 eV and a lattice constant 21 of about 5.952 Å.

The lattice constant transition layer 20, as mentioned above, gradually makes a transition from the lattice constant of the first subcell 22 to the lattice constant of the second subcell 24, while remaining substantially transparent to all infrared radiation wavelengths that are not absorbed by the first subcell 22, as illustrated by the example PV converter 10 of FIG. 1. In that specific example, the first subcell 22 has a bandgap ($E_{g1}$) 14 of about 0.74 eV and lattice constant of about 5.87 Å, while the second subcell 24 has a bandgap ($E_{g2}$) 19 of about 0.55 eV and lattice constant of about 5.952 Å, as explained above. Therefore, the lattice constant transition layer 20 has to make a transition of lattice constants gradually from about 5.87 Å to about 5.952 Å. As shown in FIGS. 1 and 3, adding As to InP to produce $InAs_yP_{1-y}$ increases the lattice constant of the $InAs_yP_{1-y}$ from about 5.87 Å to about 5.952 Å without decreasing the bandgap of the $InAs_yP_{1-y}$ to a level below the 0.74 eV $Ga_xIn_{1-x}As$ (x=0.47) of the first subcell 22. Therefore, the $InAs_yP_{1-y}$ lattice constant transition layer 20 remains transparent to all of the remaining infrared radiation R that is not absorbed in the first subcell 22 so that it allows all of such remaining infrared radiation to reach the second subcell 24.

As also mentioned above, such graded transition of the $InAs_yP_{1-y}$ lattice constant transition layer 20 from the lattice constant of the first subcell 22 (e.g., 5.87 Å) to the lattice constant of the second subcell 24 (e.g., 5.952 Å) can be done by increasing the proportion of As on a gradual continuous basis or, in incremental discrete steps as illustrated by line 23 in the bandgap chart in FIG. 1. The stepped lattice constant transition 23 illustrated in FIG. 1 seems to provide better experimental results than gradual, continuous grading.

A more specific example of the monofacial PV converter 10 of FIG. 1 with auxiliary layers useful in actual implementation of such a device for high quality performance characteristics is shown diagrammatically in FIG. 2. Again, the thicknesses of the various layers are not illustrated in actual size or thickness proportions in relation to each other.

The substrate 26 may be InP doped with a deep acceptor element, such as Fe, (sometimes denoted as InP:Fe or as (Fe) InP) to trap electrons and thereby suppress or prevent free carrier absorption. The substrate 26 can be semi-insulating for isolation or p-type for conducting, as desired for a particular application, and other layers and components are designated as either n-type or p-type, accordingly to provide the n/p junctions 34, 48 needed to convert the incident radiation R to electricity in the subcells 22, 24, respectively. However, p/n junctions would also work, as is understood by persons skilled in the art, so these n-type and p-type designations could be reversed by substituting donor dopants for acceptor dopants and vice versa, which would be considered equivalent for purposes of this disclosure.

While the subcells 22, 24 can be simple shallow homojunctions, this embodiment is particularly conducive to the more efficient, lattice-matched, double-heterostructure subcells 22, 24 illustrated in FIG. 2. Specifically, the example first subcell 22 illustrated in FIG. 2 has a n/p homojunction 34 formed by a p-type $Ga_xIn_{1-x}As$ base layer 38 grown epitaxially on an n-type $Ga_xIn_{1-x}As$ emitter layer 36, all of which is sandwiched between front and back cladding layers 40, 42 of n-type InP and p-type InP, respectively. The InP in the cladding layers 40, 42 is a different compound than the $Ga_xIn_{1-x}As$ in the homojunction layers 36, 38, but it has the same lattice constant as the $Ga_xIn_{1-x}As$. Therefore, the first subcell 22 is a lattice-matched, double-heterostructure. The cladding layers 40, 42 passivate dangling bonds at terminated $Ga_xIn_{1-x}As$ crystal structures at the front of layer 36 and at the rear of layer 38, which otherwise function, at least to some extent, as unwanted recombination sites for minority carriers in the $Ga_xIn_{1-x}As$. Also, the band offsets between the InP (bandgap of 1.35 eV) and the $Ga_xIn_{1-x}As$ (bandgap of 0.74 eV in this example) repel minority carriers away from the InP/$Ga_xIn_{1-x}As$ interface, which further reduces such unwanted recombination of minority carriers. Therefore, a clad subcell, such as the lattice-matched (LM), double-heterostructure (DH), InP/$Ga_{0.47}In_{0.53}As$ or optional InP/$Ga_xIn_{1-x}As_yP_{1-y}$ subcell 22 described above, is more efficient in converting radiant energy to electricity than non-clad subcells. This passivation and confinement of minority carriers by the cladding layers 40, 42 is possible in the monolithic, multi-bandgap PV converter structures, because the cladding material, InP, has the same lattice constant (5.869 Å) as, and a higher bandgap than, the homojunction cell material, $Ga_xIn_{1-x}As$ or $Ga_xIn_{1-x}As_yP_{1-y}$ ($Ga_xIn_{1-x}As_yP_{1-y}$ is lattice-matched to InP when $y \approx 2.2x$).

The second subcell 24 may also be a lattice-matched, double-heterostructure comprising a homojunction 48 formed by n-type and p-type layers 50, 52 of either ternary $Ga_xIn_{1-x}As$ or quaternary $Ga_xIn_{1-x}As_yP_{1-y}$, but its lattice constant is larger than the lattice constant of the first subcell 22 and of the InP substrate 26, as explained above. Consequently, the second subcell 24 is lattice-mismatched (LMM) in relation to the InP substrate 26 and first cell 22, and it cannot be clad with InP. However, as explained above in relation to the lattice constant transition layer 20, $InAs_yP_{1-y}$ can be formulated to have the same lattice constant as the $Ga_xIn_{1-x}As$ or $Ga_xIn_{1-x}As_yP_{1-y}$ homojunction layers 50, 52. Therefore, the passivation and confinement cladding layers 54, 56 of the second subcell 24 comprise $InAs_yP_{1-y}$ that is lattice-matched to the $Ga_xIn_{1-x}As$ or $Ga_xIn_{1-x}As_yP_{1-y}$ homojunction layers 50, 52 to form the lattice-matched, double-heterostructure of that subcell 24.

Prior to growing the first subcell 22, a buffer layer 32 of n-InP about 300 Å thick is deposited first on a surface 25 of the InP substrate 26 to begin an epitaxial InP growth layer, if needed. If the InP substrate 26 is doped with a deep acceptor to be electrically insulating or semi-insulating as explained above, then provisions have to be made for a front electrical contact 29 and a conductive layer 33 for accommodating lateral flow of current produced by the subcells 22, 24 to or from the contact 29. Such a conductive layer 33 could be, for example, heavily n-doped InP or any other heavily doped material that is lattice-matched to the InP substrate 26 as well as transparent to all radiation wavelengths that are transmitted by the InP substrate 26. Then, the first subcell 22 comprising the lattice-matched, double-heterostructure of n-$Ga_{0.47}In_{0.53}As$/p-$Ga_{0.47}In_{0.53}As$ homojunction layers 36, 38 between the two cladding layers 40, 42 of n-InP and p-InP, respectively. As is well-known in the art, semiconductor materials are usually doped with small amounts of elements from an adjacent group of the Periodic Table of the Elements to provide the majority carriers. Therefore, an appropriate donor dopant for the Group semiconductor alloy used can be, for example, sulphur (S) from Group VI, and appropriate acceptor dopant can be, for example, zinc (Zn) from Group II. The InP buffer layer 32 grown epitaxially on the InP substrate 26 in this example is heavily ($10^{-18}$-$10^{-20}$ cm$^{-3}$) n-type doped with sulfur (S). Then, the InP front cladding layer 40 is grown epitaxially on the buffer layer 32 to a thickness of about 0.01-0.1 μm, but it is more lightly doped n-type with, for example, S to a dopant level of about $10^{16}$-$10^{20}$ cm$^{-3}$. The $Ga_{0.47}In_{0.53}As$ homojunction layers 36, 38, which lattice-match the InP substrate 26, buffer layer 32, and cladding layer 40, are grown epitaxially. Therefore, the bandgap of the first subcell 22 is about 0.74 eV, which absorbs portions of the incident radiation R with wavelengths of about 1.67 μm and less, as explained above, although other values of x and other formulations would also work in alternate embodiments. Lattice-matching quaternary $Ga_xIn_{1-x}As_yP_{1-y}$ is also possible. The emitter layer 36 of subcell 22 is grown epitaxially to a thickness in a range of about 0.1-10 μm, and is doped n-type with, for example, S to a dopant level in a range of about $10^{16}$-$10^{20}$ cm$^{-3}$. The base layer 38 is then grown epitaxially to a thickness of about 0.01-10 μm, and doped p-type to create the n/p junction 34. The p-type dopant, such as Zn in this example, is at a dopant level of about $10^{16}$-$10^{20}$ cm$^{-3}$. To complete the lattice-matched, double-heterostructure, first subcell 22, the back cladding layer 42 is grown epitaxially on the base layer 38 to a thickness of about 0.01-0.1 μm, and is p-type doped, for example, with Zn, to a dopant level of about $10^{16}$-$10^{20}$ cm$^{-3}$.

Each of the buffer layer 32, conductive layer 33, and/or cladding layer 40 can all serve any one or more of these functions, individually or together. Therefore, instead of the three distinct layers 32, 33, 40 shown in FIG. 2, one or two layers could serve those same functions, if desired.

The subcells 22, 24 can be electrically connected together in series, or they can be electrically isolated from each other, as will be described in more detail below. For a monolithic, multi-bandgap, PV device 10 in which the subcells 22, 24 are series connected, a tunnel junction comprising a layer 44 of heavily p-doped $Ga_{0.47}In_{0.53}As$ or $Ga_xIn_{1-x}As_yP_{1-y}$ followed by a heavily n-doped $Ga_{0.47}In_{0.53}As$ or $Ga_xIn_{1-x}As_yP_{1-y}$ layer 46 is deposited and grown epitaxially on the back cladding layer 42 of the first subcell 22 to facilitate low-resistive current flow in an ohmic manner between the first subcell 22 and the second subcell 24. Again, if homojunction layers 36, 38 of subcell 22 comprise $Ga_{0.47}In_{0.53}As$, as discussed above, then it may be that x=0.47 in the $Ga_xIn_{1-x}As$ of the tunnel junction layers 44, 46 in order to lattice-match them with the underlaying InP and $Ga_{0.47}In_{0.53}As$ layers described above, although other values of x and other formulations would also work. Tunnel junctions are well-known in the art, but, for purposes of this embodiment, each tunnel junction layer 44, 46 can be about 0.01-0.1 μm thick and doped to a level of about $10^{-18}$-$10^{-20}$ cm$^{-3}$. Alternative monolithic, multi-bandgap, PV converters with the subcells 22, 24 isolated electrically from each other will be described below.

The transparent, lattice constant transition layer 20 comprising gradually increasing lattice constants is deposited and grown epitaxially on the $Ga_xIn_{1-x}As$ or $Ga_xIn_{1-x}As_yP_{1-y}$ tunnel junction layer 46 in order to make the transition from the lattice constant of the InP substrate 26 and intervening layers described above to a lattice constant that matches the $Ga_xIn_{1-x}$ As or $Ga_xIn_{1-x}As_yP_{1-y}$ of the second subcell 24, which is formulated to provide a desired bandgap $E_{g2}$, as described above. According to one embodiment, the bandgap $E_{g2}$ is less than the bandgap $E_{g1}$ of the first subcell 24 in the monofacial, inverted PV converter embodiment 10 of FIGS. 1 and 2 for the reasons explained above. $InAs_yP_{1-y}$ is used for this lattice constant transition layer 20, because it can be formulated to lattice match the lower bandgap $E_{g2}$ of the $Ga_xIn_{1-x}As$ of $Ga_xIn_{1-x}As_yP_{1-y}$ of the second subcell 24, while it also remains transparent to the longer infrared radiation R wavelengths that are not absorbed by the higher bandgap $E_{g1}$ material of the first subcell 22. This feature is important in order to ensure that substantially all of the longer wavelength radiation R, which is not absorbed in the first subcell 22, reaches the second subcell 24.

To form the lattice constant transition layer 20, (As) is added to a growing layer of InP in increasing proportions so that the proportion of arsenic (As) increases in the resulting $InAs_yP_{1-y}$ material, which increases the lattice constant of the $InAs_yP_{1-y}$. As mentioned above, this change can be accomplished continuously, or the changes in proportions be made in incremental steps. In the $InAs_yP_{1-y}$ of the lattice constant transition layer 20 of this example PV converter 10, y varies from zero (where it lattice-matches the $Ga_{0.47}In_{0.53}As$ of the first subcell 22) to about 0.44, where it lattice-matches to the $Ga_xIn_{1-x}As$ of the second subcell 24, in which x≈0.26 and the consequent bandgap $E_{g2}$ is about 0.55 eV. That example bandgap $Eg_2$=0.55 eV enables the second subcell 24 to absorb infrared radiation R with wavelengths up to about 2.25 μm. In general, the lattice-matching condition of GaxIn1−xAs to InAsyP1−y occurs when the crystal lattices of the epi-layers are fully relaxed, which is where y≈2.143x.

Of course, as mentioned above, the $Ga_xIn_{1-x}As$ of the second subcell 24 can have x equal to some other value for a different desired bandgap $E_{g2}$, and the y in the $InAs_yP_{1-y}$ of the lattice constant transition layer 20 can be varied or customized accordingly to make the necessary corresponding lattice constant transition. Also, as mentioned above, either or both of the subcell materials and/or the lattice constant transition materials could be quaternary $Ga_xIn_{1-x}As_yP_{1-y}$ with the x and y values customized to desired bandgaps and lattice constants within the physical constraints illustrated by the bandgap vs. lattice parameter chart of FIG. 3.

As explained above and shown in FIG. 2, the second subcell 24 comprises a lattice-matched, double-heterostructure of n-type $InAs_yP_{1-y}$ front cladding layer 54, n-type $Ga_xIn_{1-x}As$ or $Ga_xIn_{1-x}As_yP_{1-y}$ emitter layer 50 and p-type $Ga_xIn_{1-x}As$ or $Ga_xIn_{1-x}As_yP_{1-y}$ base 52 to form the homojunction 48, and p-type $InAs_yP_{1-y}$ back cladding layer 56, all grown epitaxially on the lattice constant transition layer 20. As explained above for the first subcell 22, the cladding layers 54, 56 confine and passivate the front and back surfaces of the homojunction layers 50, 52 to prevent recombination of minority carriers. The thicknesses and doping levels of the subcell 24 layers 50, 52, 54, 56 can be similar to those described above for the first subcell 22.

A back surface spectral control element 28, which can also be used as a back electrical contact layer, can be deposited onto the back cladding layer 56 or onto an additional contacting layer (not shown) disposed atop the back cladding layer 56. The nature of the back surface spectral element 28 may depend on the application of the device 10. For example, if the device 10 is a SPV or TVP, the sole purpose of which is to convert radiation to electricity, then the back surface spectral element may comprise a reflector to reflect any remaining, unabsorbed radiation from the second subcell 24 back through the subcells 24, 22. Some of such reflected radiation could be absorbed in this second pass through the subcells, but most of it will continue propagating all the way back through the substrate 26 toward whatever radiator source (not shown) produces the incident radiation R in the first place. Adding such unabsorbed, back-reflected, radiation energy back into the radiator source may enable the radiator source to use such back-reflected energy in the production of new incident radiation R for conversion to electricity in the converter 10. This feature is particularly appropriate for TPV configurations of converter 10 that are applied to convert infrared radiation R produced by a blackbody infrared radiation source (not shown) to electricity. Any radiation reflected back into the blackbody radiator adds energy to the blackbody radiator and thereby tends to raise the temperature of the blackbody radiator, which causes the blackbody radiator to produce more blackbody infrared radiation for the converter 10. Therefore, such back-reflected radiation can help the blackbody radiator to produce more incident radiation R for the device 10 without having to use so much fuel.

On the other hand, some devices 10 are used both for producing electricity and gathering heat for an environment. In those applications, the back surface spectral control element 28 may be a material that is transparent to remaining infrared radiation that is not absorbed by the second subcell 24 so that such remaining infrared can be used as heat someplace behind the device 10.

If the layer 28 is a back surface reflector (BSR), there can be several advantages to designing the last (second) subcell 24 with only one-half of its normal thickness, i.e., one-half the thickness that would be required for full absorption of radiation in the wavelengths that correspond to the bandgap, because any unabsorbed radiation will be reflected by the BSR 28 back into the last subcell 24. The advantages of this kind of design include an enhanced photocurrent, higher operating voltage, and thinner structure that requires less growth time and provides easier device processing. Regardless of its optical characteristics, as described above, the layer 28 can also be a back surface electrical contact. Therefore, it may be electrically conductive. An optional, additional metallic contact 45 can also be used on the conductive layer 28 for making an electrical connection, if desired.

The design of the front surface spectral control element 30 on the front surface 27 of the substrate 26 may also depend on usage of the device 10. For example, if the device 10 is to be used only for producing electricity from blackbody radiation, the front surface spectral control element 30 may be a coating layer that transmits only shorter wavelength incident radiation R that can be absorbed and converted to electricity by the subcells 22, 24 and that reflects all longer wavelength incident radiation R back into the blackbody radiator (not shown) for recovery and re-use. On the other hand, if the device 10 is to be used both for producing electricity and heat for an environment, then the front surface spectral control element 30 may be an antireflective coating to enhance transmission of all the incident radiation R into the device 10.

Figure 4:
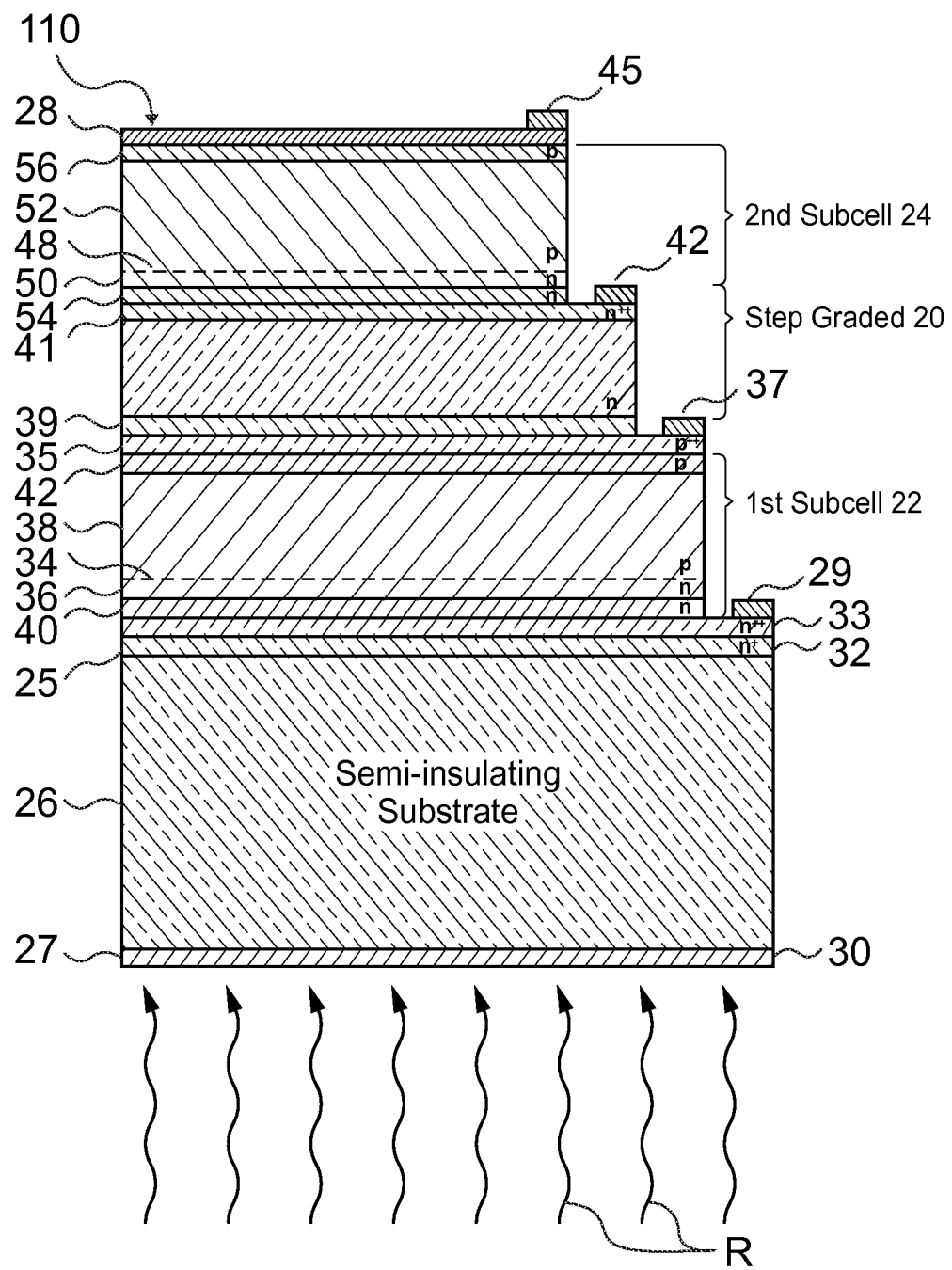
FIG. 4 is a detailed cross-sectional view of a monofacial, inverted, multi-bandgap, monolithic, photovoltaic device similar to FIGS. 1 and 2, but with the subcells isolated electrically for independent connection.

As mentioned above, the monofacial PV converter 10 described above and illustrated in FIGS. 1 and 2 is configured with the subcells 22, 24 connected electrically in series facilitated by the tunnel junction layers 44, 46. An alternate embodiment monofacial, low-bandgap, monolithic, multi-bandgap, PV converter 110 is shown in FIG. 4 with much the same first subcell 22, second subcell 24, and substrate 26 structures and materials described above for the PV converter 10, but with the subcells 22, 24 isolated electrically from each other. The electrical isolation instrumentality in the PV converter 110 is illustrated as a discrete electrical isolation layer 39 positioned between the first subcell 22 and the second subcell 24. However, such electrical isolation function could be incorporated into other components, such as into the graded lattice constant transition layer 20, as will be explained below.

There are a number of reasons that such electrical isolation of the subcells 22, 24 may be desirable in some applications. For example, as mentioned above, current flow through series connected subcells 22, 24 is limited by the lowest photocurrent producing subcell. Therefore, for series connected subcells, a number of subcell design factors, such as bandgaps, thicknesses, doping concentrations, and the like are used to optimize the operating characteristics of the series connected subcells 22, 24, so that electric power production from the tandem combination is maximized. In some designs and applications, however, more efficient conversion of radiant energy to electricity can be accomplished by extracting electric power from the individual subcells 22, 24 separately or independently, or, in some applications, to design the subcells 22, 24 for voltage matching. Such voltage matching techniques with subcells in other devices will be discussed in more detail below in relation to monolithic, integrated module (MIM) devices.

To isolate the subcells 22, 24 electrically from each other, there has to be some material between them that inhibits electric current flow between the subcells 22, 24. However, such electrical isolation material cannot interfere with radiation transmission from one subcell 22 to the other subcell 24. In the PV converter 110 of FIG. 4, a discrete isolation layer 39 is shown positioned between the first subcell 22 and the lattice constant transition layer 20, although it could be positioned between the lattice constant transition layer 20 and the second subcell 24.

An isolation material for isolation layer 39 can be fabricated in a number of ways. One such approach is to fabricate the isolation layer 39 with a high-resistivity semiconductor material that has a high enough bandgap to be transparent to the longer wavelength radiation that is not absorbed in the first subcell 22 and is being transmitted to the second subcell 24. Another such approach is to form the isolation layer 39 as an isolation diode, which, of course, may also be transparent to the radiation being transmitted from the first subcell 22 to the second subcell 24. Also, such high-resistivity material or isolation diode material has to be lattice-matched to the materials in front and in back of it, which, in the position of isolation layer 39 shown in FIG. 4, has to be lattice-matched to the first cell 22 and substrate 26.

As mentioned above, InP doped with a deep acceptor element, such as Fe or Cr, is a high-resistivity material and has a bandgap (1.35 eV) that makes it transparent to all radiation that is not absorbed by the first subcell 22. It is also lattice-matched to the InP substrate 26 and to the ternary $Ga_{0.47}In_{0.53}As$ or quaternary $Ga_xIn_{1-x}As_yP_{1-y}$ of the first subcell 22. Therefore, deep acceptor-doped InP can be used as the high-resistivity, isolation layer 39. Such deep acceptor-doping of other lattice-matched semiconductor materials, such as ternary $Ga_xIn_{1-x}As$, quaternary $Ga_xIn_{1-x}As_yP_{1-y}$, or even AlGaInAs in some circumstances, with high enough bandgaps to be transparent to the radiation being transmitted, could also be used to provide suitable high-resistivity materials for the isolation layer 39.

An isolation diode for isolation layer 39 can be provided by one or more doped junctions, such as an n-p junction or n-p-n junctions with high enough reverse-bias breakdown characteristics to prevent current flow between the subcells 22, 24. Again, lattice-matched semiconductor materials, such as InP, $Ga_xIn_{1-x}As$ or $Ga_xIn_{1-x}As_yP_{1-y}$, or even AlGaInAs, can be doped to provide an isolation diode structure for isolation layer 39.

While a discrete isolation layer 39 is shown in the PV converter 110 of FIG. 4, it is possible to dope the lattice constant transition layer 20 to also function as an isolation layer between the two subcells 22, 24. The $InAs_yP_{1-y}$ of the lattice constant transition layer 20 can also be doped with a deep acceptor element, such as Fe or Cr, to make it highly-resistive, or discrete sublayers of the $InAs_yP_{1-y}$ can be n-p or n-p-n doped to form an isolation diode structure.

Of course, with each subcell 22, 24 isolated electrically from each other, some additional provisions for electrical contacts are necessary to extract electric power independently from each subcell 22, 24. Persons skilled in the art will be able to design myriad structures for such contacts, once they understand the principles described in this disclosure. The example additional contacts 27, 42 for this purpose are shown fabricated on lateral current flow layers 39, 41 respectively. Such lateral current flow layers 39, 41 are lattice-matched to their respective subcells 22, 24 and should be transparent to radiation being transmitted from the first subcell 22 to the second subcell 24. Heavily doped $GaIn_{1-x}As_yP_{1-y}$ with $0 \leq x \leq 1$ and $0 \leq y \leq 1$ as necessary for lattice matching and transparency can be used for these lateral current flow layers 39, 41.

While the series connected PV converter 10 and isolated or independently connected PV converter 110 described above are illustrated with only two subcells 22, 24, and only one lattice constant transition layer 20 between them, any number of subcells with any number of lattice constant transition layers can be included in a monolithic, multi-bandgap, optoelectronic device according to alternate embodiments. To illustrate this principle, a more complex monolithic, multi-bandgap, PV converter 112 is illustrated in FIG. 5.

In the PV converter 112, an arbitrary number (five) subcells 114, 116, 118, 120, 122 are illustrated with arbitrary bandgaps $E_{g1} > E_{g2} > E_{g3} > E_{g4} > E_{g5}$. The substrate 124 is InP, and the first and second subcells 114, 116 both have bandgaps $E_{g1}$, $E_{g2}$ that can be ternary GaInAs or quaternary GaInAsP and are lattice-matched to the InP substrate 124 (see, e.g., lines 130, 12, 14 in FIG. 3). These first and second subcells 114, 116 may be both lattice-matched (LM), double-heterostructures (DH) with junctions comprising n-type and p-type ternary $Ga_xIn_{1-x}As$ or quaternary $Ga_xIn_{1-x}As_yP_{1-y}$ clad with n-type and p-type layers of InP, as described above for the other PV converter embodiment 10. The third and fourth subcells 118, 120 are LM, DH ternary or quaternary GaInAs (P) with bandgaps $E_{g3}$, $E_{g4}$ that can be lattice-matched to each other, but not to the InP substrate (see, e.g., lines 12, 132, 134, 136 in FIG. 3). Therefore, a lattice constant transition layer 126 of graded $InAs_yP_{1-y}$ is used to make the transition from the second subcell 116 to the lattice-mismatched subcell 118. A fifth LM, DH subcell 122 of ternary or quaternary GaInAs (P) has a bandgap $E_{g5}$ that cannot be lattice-matched to the fourth subcell 120. Therefore, another lattice constant transition layer 128 is provided to make the transition from the fourth subcell 120 to the lattice-mismatched fifth subcell 122.

Figure 5:
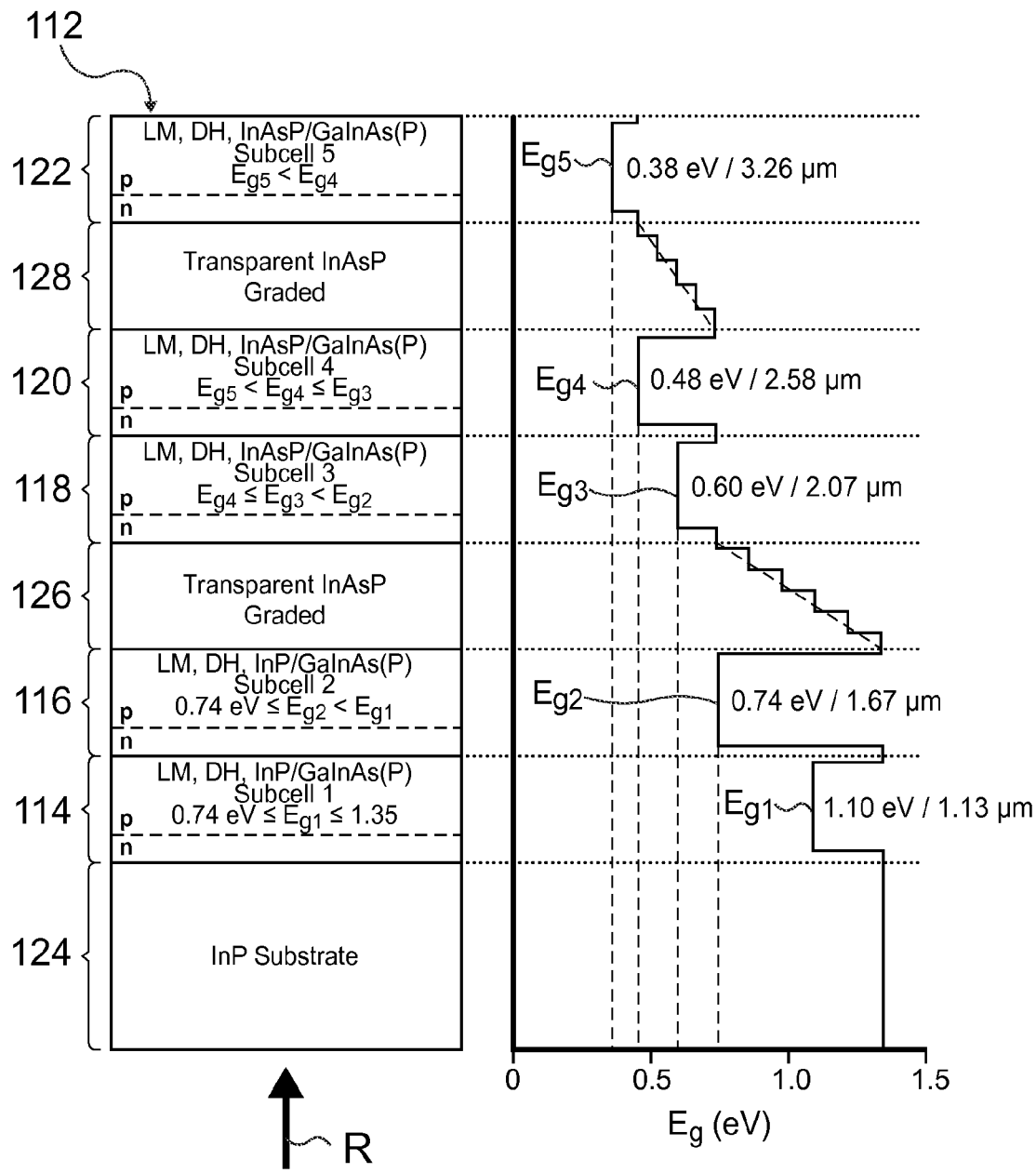
FIG. 5 is a simplified cross-sectional view of a photovoltaic device illustrating more subcells and graded transparent layers according to one or more embodiments described herein.

As mentioned above, the numbers and combinations of subcells and lattice constant transition layers as well as the specific example bandgap values shown in the PV converter 112 of FIG. 5 are selected arbitrarily for illustrative purposes. The only requirement is that the incident radiation reaches the subcells in order of decreasing bandgaps, so that the shorter wavelength radiation is absorbed and converted to electricity by higher bandgap subcells that will transmit unabsorbed, longer wavelength radiation to the next subcell(s). Other details, such as buffer layers, tunnel junction or isolation layers, contacts, optic control layers, etc., for fabricating a working PV converter can be similar to those described above for either the series connected subcell embodiments 10 of FIGS. 1 and 2 or the independently connected subcell embodiment 110 of FIG. 4.

Figure 6:
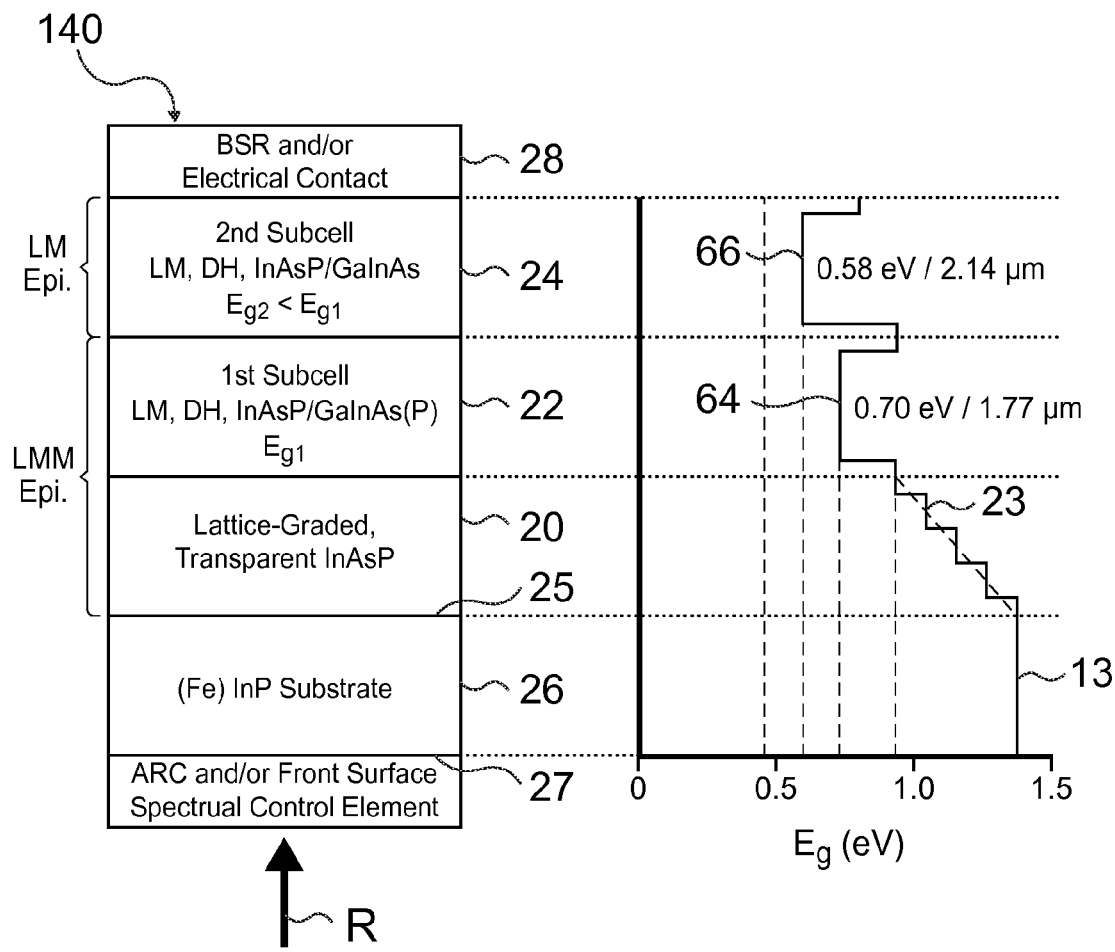
FIG. 6 is a diagrammatic illustration of a variation of the monolithic, multi-bandgap, photovoltaic converter similar to FIG. 1, but with the lattice constant transition layer positioned between the substrate and the first subcell.

Now, as illustrated in another alternative inverted, monofacial, multi-bandgap, PV converter 140 in FIG. 6, the positions of the transparent lattice constant transition layer 20 and the first subcell 22 positions can be reversed from their positions shown in the FIG. 1 embodiment 10. Specifically, the lattice constant transition layer 20 can be grown epitaxially on the InP substrate 26 by gradually adding more and more As to the growing $InAs_yP_{1-y}$ lattice constant transition layer 20, as described above, until a desired lattice constant is attained for a desired $Ga_xIn_{1-x}As$ or $Ga_xIn_{1-x}As_yP_{1-y}$ semiconductor material with a desired bandgap to be grown on the InP substrate 26. As explained above, the desire bandgap is chosen for absorbing and converting infrared radiation R of a desired wavelength or frequency band to electricity.

Figure 7:
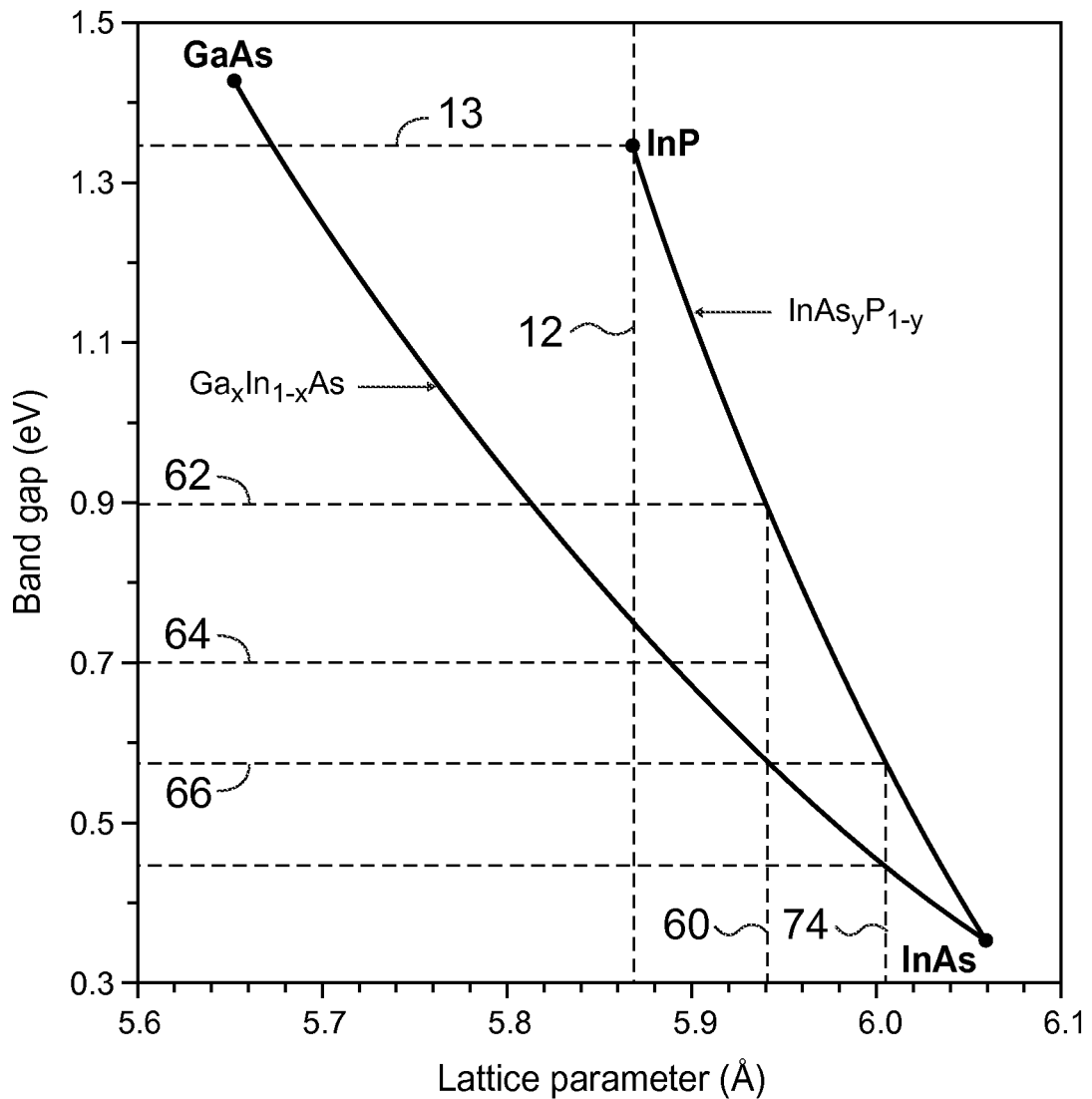
FIG. 7 is a bandgap versus lattice parameter chart showing bandgap and lattice constant parameters of the semiconductor materials used as examples in the embodiment of FIG. 6.

For example, but not for limitation, if it is desired to have the first subcell 22 in the PV converter 140 of FIG. 6 absorb and convert infrared radiation of at most 1.77 μm wavelength to electricity and to have the second subcell 24 absorb and convert infrared radiation in the range of 1.77 μm to 2.14 μm to electricity, the first subcell 22 would need a bandgap of about 0.70 eV, and the second subcell 24 would need a bandgap of about 0.58 eV. Therefore, an appropriate lattice constant transition layer 20 can be $InAs_yP_{1-y}$ with a gradually increasing proportion of As until an $InAs_yP_{1-y}$ semiconductor material having a lattice constant of about 5.94 Å and a bandgap of about 0.90 eV, as illustrated in FIG. 7 by broken lines 60, 62, respectively. Therefore, a lattice constant transition layer 20 with those criteria will provide a transition of lattice constant 12 from the 5.87 Å of the InP substrate to the 5.94 Å of the terminal $InAs_yP_{1-y}$ material in the lattice constant transition layer 20. With a terminal bandgap of 0.90 eV, the lattice constant transition layer 20 is transparent to infrared radiation (IR) with wavelengths longer than about 1.38 μm.

The first subcell 22 with the example desired 0.70 eV bandgap can then be a lattice-matched (LM), double-heterostructure (DH) of, for example, $InAs_yP_{1-y}/Ga_xIn_{1-x}As_yP_{1-y}$ with the same lattice constant, 5.94 Å, as the terminal $InAs_yP_{1-y}$ of the lattice constant transition layer 20 (see broken line 60 in FIG. 7). The $Ga_xIn_{1-x}As_yP_{1-y}$ base of the subcell 22 can be formulated to have the desired bandgap of 0.70 eV (see broken line 64 in FIG. 7 and corresponding line 64 in FIG. 6), so it will absorb and convert 1.77 μm and shorter radiation R to electricity, but it will transmit and not absorb virtually all the incident infrared radiation (IR) that is longer wavelength than 1.77 μm. Such formulation of appropriate proportions of Group III-V elements in quaternary alloys, such as the $Ga_xIn_{1-x}As_yP_{1-y}$ in this example, to achieve certain desired bandgap characteristics, such as the 0.70 eV in this example, is well-known and within the capabilities of persons skilled in the art, thus need not be explained in detail here to enable persons skilled in the art to understand and practice these embodiments.

The second subcell 24 in this example can be formulated with a lattice-matched (LM), double-heterostructure (DH) with the same lattice constant of 5.94 Å as the first subcell 22 and still have a bandgap as low as 0.58 eV (see broken lines 60, 66 in FIG. 7). Therefore, if it is desired to formulate the second cell 24 to absorb and convert as much of the infrared radiation R, which passed through the first cell 22, as possible, and still be lattice-matched to the first cell 22, then $Ga_xIn_{1-x}As$ with a bandgap of 0.58 eV can be used. This example second cell 24, with its 0.58 eV bandgap 66, would absorb and convert infrared radiation R of 2.14 μm wavelength and shorter to electricity. Of course, other auxiliary layers, such as buffers, cladding, tunnel junction or isolation layers, contacts, and antireflective or optical control layers can be used to make this structure a functioning device, as explained above, and as would be understood by persons skilled in the art.

While two lattice-mismatched (LMM) subcells 22, 24 and one lattice constant transition layer 20 in any of a variety of ternary and/or quaternary formulations comprising Ga, In, As, and/or P provide wide flexibility in low bandgap designs for efficient absorption and conversion of desired infrared radiation wavelength bands to electricity, embodiments also extends to three, four, five, or more subcells and bandgaps with one or more lattice constant transition layers, as needed. For example, there is no theoretical limit to the number of quaternary $Ga_xIn_{1-x}As_yP_{1-y}$ formulations for different bandgaps between lines 13 and 14 (0.74 eV to 1.35 eV) in FIG. 3, which can be lattice-matched on line 12 (5.869 Å). Likewise, there is no theoretical limit to the number of quaternary $Ga_xIn_{1-x}As_yP_{1-y}$ formulations for different bandgaps between lines 14 and 17 (0.74 eV to 0.52 eV) in FIG. 3, which can be lattice-matched on line 15 (5.968 Å). Further, there is no theoretical limit to the number of ternary and quaternary Ga, In, As, and/or P formulations for possible lattice constants between those of InP (5.869 Å) and InAs (6.059 Å), lines 12 and 23, respectively, in FIG. 3.

In other words, every ternary $Ga_xIn_{1-x}As$ or quaternary $Ga_xIn_{1-x}As_yP_{1-y}$ with a bandgap in the range between 0.74 eV and 0.355 eV (lines 14 and 31 in FIG. 3) can be lattice-matched to some higher bandgap $InAs_yP_{1-y}$, which is transparent to at least some infrared radiation that can be absorbed and converted to electricity by such ternary $Ga_xIn_{1-x}As$ or quaternary $Ga_xIn_{1-x}As_yP_{1-y}$DH subcells. Further, any $InAs_yP_{1-y}$, which is used to make a transition between the lattice constant of such ternary $Ga_xIn_{1-x}As$ or quaternary $Ga_xIn_{1-x}As_yP_{1-y}$ to a larger lattice constant, also has a higher bandgap than such $Ga_xIn_{1-x}As$ or $Ga_xIn_{1-x}As_yP_{1-y}$, thus is transparent to at least some infrared radiation that can be absorbed and converted to electricity by such ternary $Ga_xIn_{1-x}As$ or quaternary $Ga_xIn_{1-x}As_yP_{1-y}$ DH subcells. One or more embodiments described herein utilize these characteristics of $Ga_xIn_{1-x}As_yP_{1-y}$ ($0 \leq x \leq 1$, $0 \leq y \leq 1$) for the design, formulation, and fabrication of low bandgap (less than 1.35 eV, and may be less than 0.74 eV), monolithic, multi-bandgap, photovoltaic converters, as described above, and as will be further described below.

Embodiments describer by this disclosure, as mentioned above, also extends to low bandgap, monolithic, multi-bandgap PV converters with more than one lattice constant transition layer. For example, referring again to FIG. 6, one or more additional subcells with even lower bandgap(s) than the 0.58 eV bandgap of the second subcell 24 can be grown on top of subcell 24. Such an example PV converter 150 with three subcells 22, 24, 72 is illustrated diagrammatically in FIG. 8. This example three-bandgap PV converter 150 is illustrated for convenience with the same substrate 26, first lattice constant transition layer 20, first subcell 22, and second subcell 24 as the two-bandgap embodiment 140 of FIG. 6, but it has a second lattice constant transition layer 70 positioned between the second subcell 24 and a third subcell 72.

As was explained above in relation to the inverted tandem (two-subcell) PV converter 140 in FIG. 6, the InP substrate 26 and the first lattice constant transition layer 20 are transparent to infrared radiation of longer wavelengths than can be absorbed by their respective bandgap characteristics. Therefore, in the examples of FIGS. 6 and 8, the lowest bandgap of the $InAs_yP_{1-y}$ lattice constant transition layer 20 is 0.90 eV (see line 62 in FIG. 7), which, of course, is also lower than the 1.35 eV bandgap of the InP substrate. Therefore, infrared radiation of wavelengths longer than 1.38 μm pass through both the InP substrate 26 and the $InAs_yP_{1-y}$ lattice constant transition layer 20. The first subcell 22, with its 0.70 eV bandgap, absorbs and converts infrared radiation R wavelengths of 1.77 μm and shorter to electricity, and it transmits infrared radiation R wavelengths longer than 1.77 μm to the second subcell 24. The 0.58 eV bandgap of the $Ga_xIn_{1-x}As$ second subcell 24 enables it to absorb and convert infrared radiation wavelengths of 2.14 μm and shorter to electricity, while infrared radiation R wavelengths greater than 2.14 μm pass through the second subcell 24.

Figure 8:
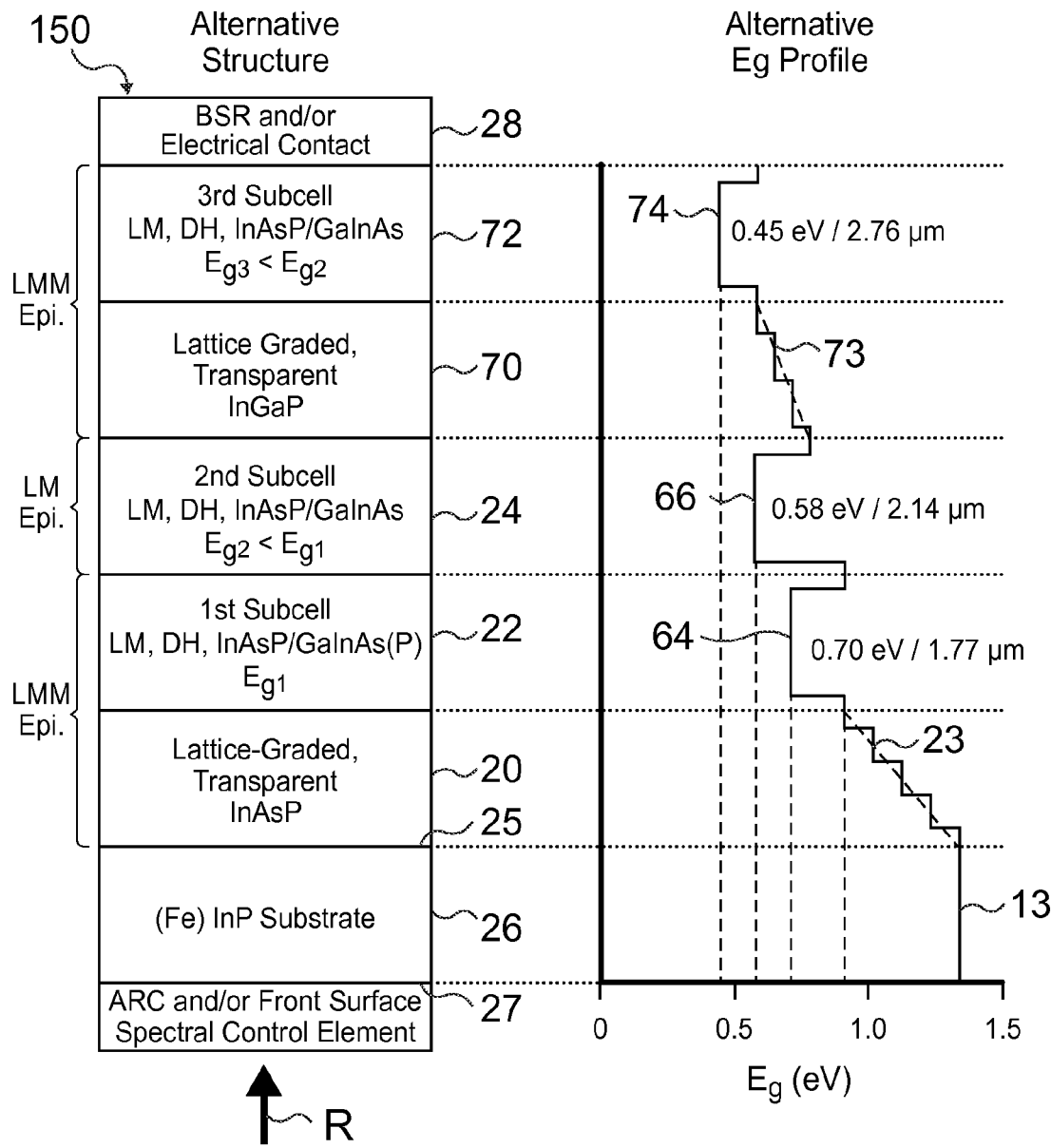
FIG. 8 is a diagrammatic illustration of a variation of the monolithic, multi-bandgap, photovoltaic converter similar to FIG. 6, but with an additional lattice constant transition layer and an additional subcell added to the structure.

The energy in the infrared radiation R wavelengths longer than 2.14 μm, which are not absorbed in the second subcell 24 would be wasted in the PV converter 140 embodiment of FIG. 6, but adding one or more additional subcells, such as subcell 72 in the three-bandgap PV converter 150 in FIG. 8, can capture and convert significant amounts of that energy to electricity. However, as shown by line 60 in FIG. 7, there is no ternary $Ga_xIn_{1-x}As$ or quaternary $Ga_xIn_{1-x}As_yP_{1-y}$ with a bandgap below 0.58 eV (line 66) that has the same lattice constant (5.94 Å) as the first and second subcells 22, 24 in the example. Therefore, a second lattice constant transition layer 70 comprising $InAs_yP_{1-y}$ with gradually increasing proportions of arsenic (As) is positioned between the second subcell 24 and the third subcell 72. The initial $InAs_yP_{1-y}$ in the second lattice constant transition layer 70 is formulated to have a bandgap of 0.90 eV, so that it has the same lattice constant (5.94 Å) as the second subcell 24. Then, the subsequent $InAs_yP_{1-y}$ grown for the second lattice constant transition layer 70 decreases in bandgap in incremental steps or gradually toward the same bandgap 66 as the second subcell 24, which is 0.58 eV in the example described above. At that bandgap level, the $InAs_yP_{1-y}$ is still transparent to all of the infrared radiation R wavelengths that pass through the second subcell 24. Therefore, the $InAs_yP_{1-y}$ second lattice constant transition layer 70 does not absorb or interfere with the infrared radiation R that has to reach the third subcell 72, yet it provides a transition from the lattice constant of the second subcell 24 (line 60 in FIG. 7) to a new, larger lattice constant (line 74 in FIG. 7) for the third subcell 72. In this example, the new lattice constant of 6.02 Å will match a ternary $Ga_xIn_{1-x}As$ with a bandgap of 0.45 eV or quaternary $Ga_xIn_{1-x}As_yP_{1-y}$ with a bandgap anywhere along line 94 between 0.58 eV and 0.45 eV, as shown in FIG. 7. Therefore, if the third subcell 74 in FIG. 8 comprises, for example, $Ga_xIn_{1-x}As$ formulated to have a bandgap of 0.45 eV, it will absorb and convert infrared radiation in wavelengths of 2.76 μm and shorter to electricity.

Again, as explained above for the first lattice constant transition layer 20, the gradual change of lattice constant in the second lattice constant transition layer 70 can be graded gradually or in discrete stepped increments. Also, while not shown in detail in FIG. 8, the $Ga_xIn_{1-x}As$ n/p junction in the third subcell 72 may be clad front and back with cladding layers of $InAs_yP_{1-y}$, which have the same lattice constant as the $Ga_xIn_{1-x}As$ of the third subcell 74, to form the third subcell 72 as a lattice-matched (LM), double-heterostructure (DH) subcell. Other auxiliary layers mentioned above can also be provided.

All of the PV converter embodiments 10, 110, 140, 150 described above have been monofacial, i.e., grown on only one face of the substrate. A significant feature of one or more embodiment is that they can also be implemented in bifacial or buried substrate structures, as illustrated diagrammatically by the example low bandgap, monolithic, multi-bandgap, PV converter 80 in FIG. 9. Essentially, in the PV converter 80 of FIG. 9, a lattice-matched (LM) first subcell 82 is grown epitaxially on a front surface 83 of a InP substrate 84, and a lattice-mismatched (LMM) second subcell 86 with an intervening lattice constant transition layer 90 is grown epitaxially on a back surface 85 of the substrate 84. An antireflective coating (ARC) 88 on the front surface 81 of the first subcell 82 and a back surface reflector (BSR) 89 on the back surface 87 of the second subcell 86 are shown, but they can be other optical control layer materials, as described above for PV converter 10. Again, other auxiliary features, layers, and components that may be used to implement an actual device, such as buffers, contacts, deep acceptor doping of the InP substrate, tunnel junctions or isolation layers, and the like are not shown separately in FIG. 9 in order to avoid unnecessary clutter and repetition, but persons skilled in the art can use the information herein to understand, design, and fabricate such components in PV converter devices according to embodiment described herein. Cladding layers (not shown separately in FIG. 9) can be used as part of the subcells 82, 86 for lattice-matched (LM), double-heterostructure (DH) implementations of the subcells, as described above in relation to the PV converter 10. Also, while only one lattice constant transition layer 90 and two subcells 82, 86 with specific example bandgaps and lattice constants are illustrated in the example PV converter 80 in FIG. 9, other numbers of subcells, lattice constant transition layers, bandgaps, and/or lattice constants can also be used, as explained above.

Figure 9:
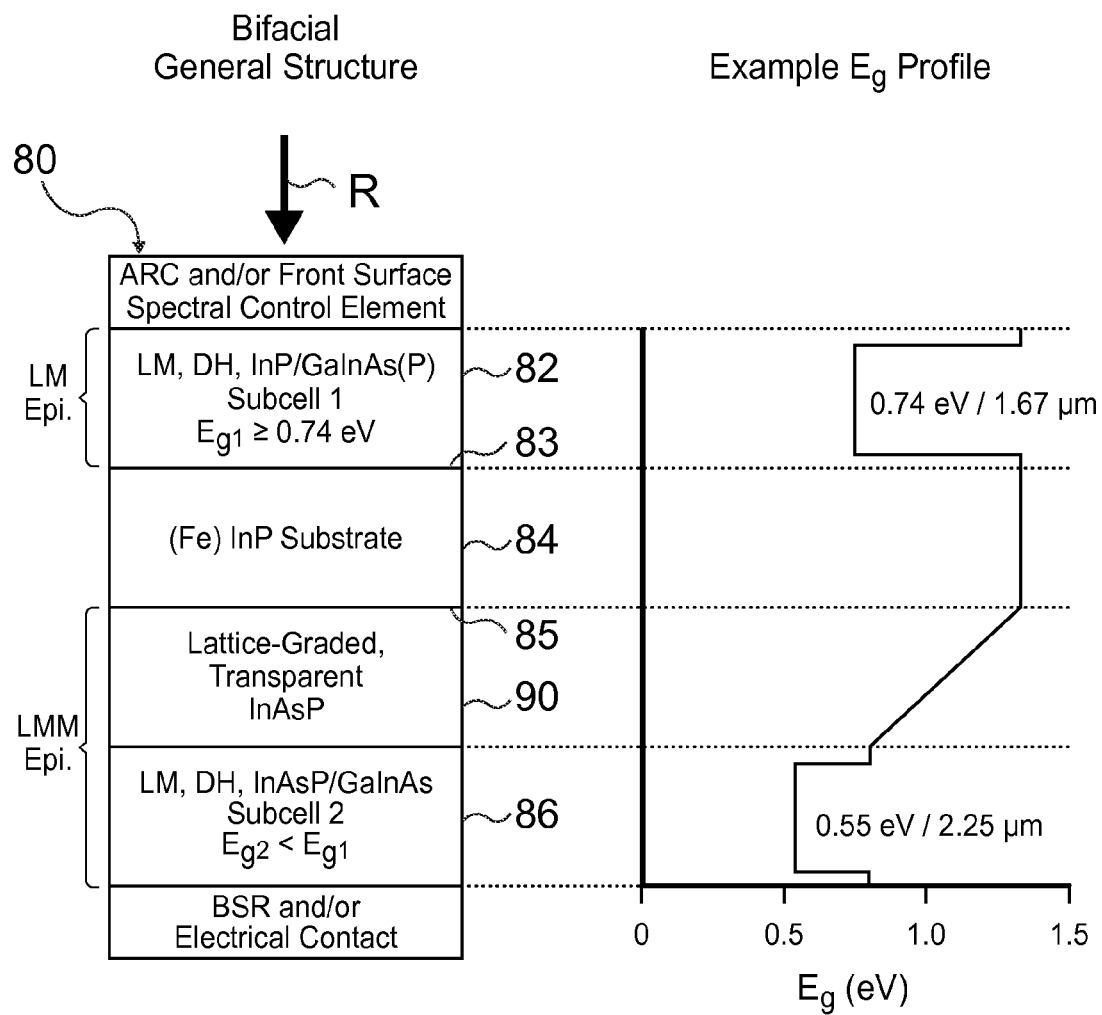
FIG. 9 is a diagrammatic illustration of a bifacial, buried substrate embodiment in which subcells are grown epitaxially on opposite faces of the substrate.
Figure 10:
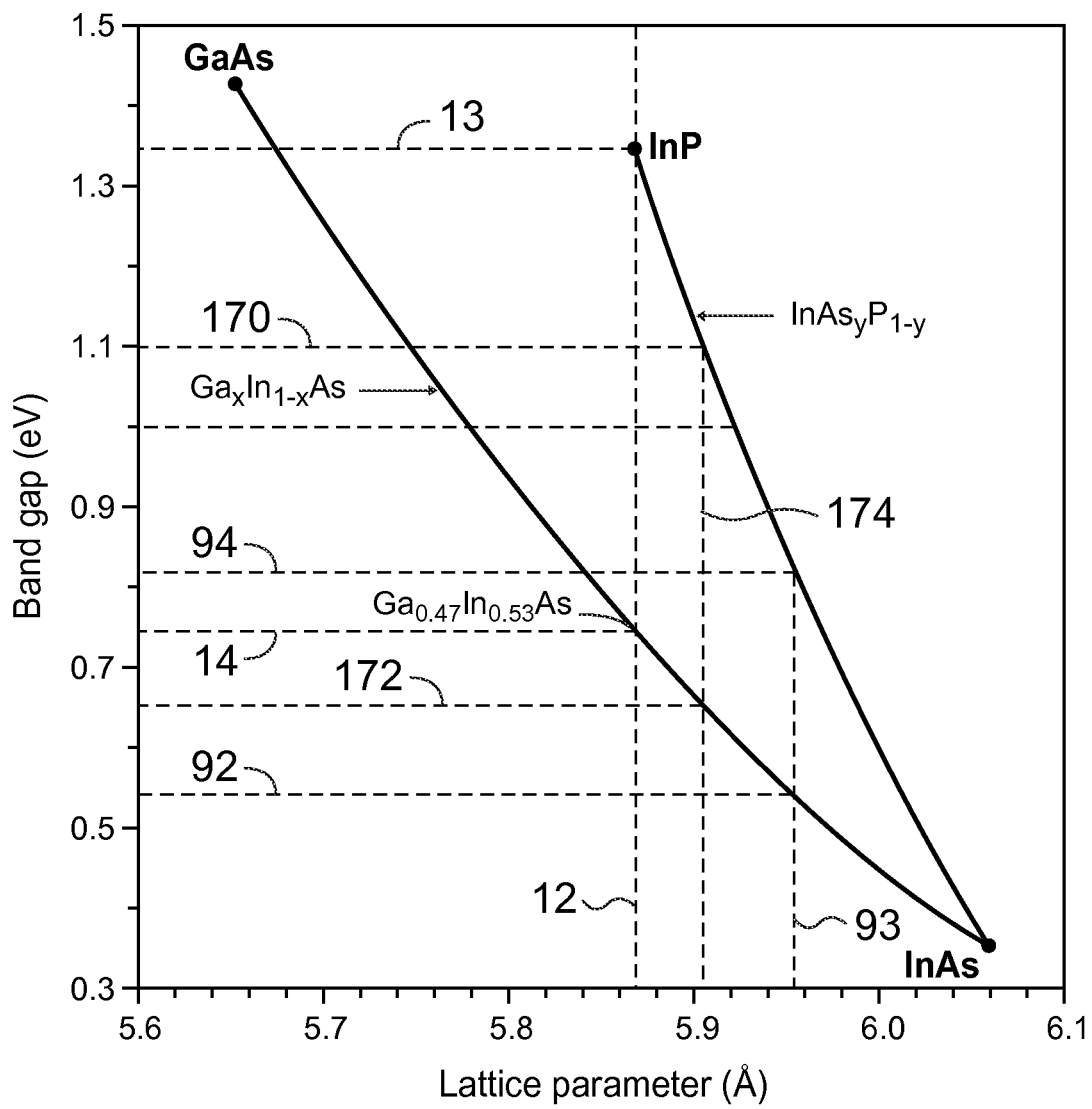
FIG. 10 is a bandgap versus lattice parameter chart showing bandgap and lattice constant parameters of the semiconductor materials used as examples in the embodiment of FIGS. 9 and 11.

In the example bifacial PV converter 80 in FIG. 9, the first subcell 82 is lattice-matched to the InP substrate 84 (line 12 in FIG. 10). In this example, subcell 82 is formulated to have the lowest possible bandgap that can be lattice-matched to the InP substrate 84, which is the ternary $Ga_{0.47}In_{0.53}As$ with a bandgap of 0.74 eV (line 14 in FIG. 8), although many other formulations could be illustrated, as explained above. If it is desired to use a lattice-matched, double-heterostructure for the first subcell 82, the $Ga_{0.47}In_{0.53}As$ n/p junction material can be clad on both sides with lattice-matched, epitaxially grown, InP cladding layers, as described above.

In this example, any incident radiation R of wavelengths shorter than 1.67 μm will be absorbed by the 0.74 eV bandgap $Ga_{0.47}In_{0.53}As$ in the first subcell 82, and longer wavelength infrared radiation R will pass through the first subcell 82. The InP substrate 84, which has a much higher bandgap of 1.35 eV (line 13 in FIG. 10) is also transparent to any of such longer wavelength infrared radiation that passes through the first subcell 82. Therefore, in order for the second subcell 86 to absorb and convert any of such longer wavelength infrared radiation R to electricity, it has to have a bandgap $E_{g2}$ that is less than the bandgap $E_{g1}$ of the first subcell 82, i.e., less than 0.74 eV in this example. There are many considerations for selecting the lower bandgap for the second subcell 86, such as targeting the concentrations of the infrared radiation in various wavelength or frequency bands, conversion efficiencies, and any additional subcells (not shown in FIG. 9). However, any bandgap less than 0.74 eV requires a $Ga_xIn_{1-x}As$ or $Ga_xIn_{1-x}As_yP_{1-y}$ that has a larger lattice constant than the InP substrate 84, so it would not be possible for it to be lattice-matched to the InP substrate 84. Therefore, in such an embodiment, a lattice constant transition layer 90 may be needed, and the second subcell 86 may have a lattice constant that allows the $InAs_yP_{1-y}$ lattice constant transition layer 90 to be transparent to the longer infrared radiation wavelengths, which are not absorbed by, and pass through, the first subcell 82. In this example, a bandgap $E_{g2}$ for the second subcell 86 is selected to be 0.55 eV, which can be provided with ternary $Ga_xIn_{1-x}As$ having a lattice constant of 5.972 Å, as illustrated by lines 92 and 93 in FIG. 10. However, a quaternary $Ga_xIn_{1-x}As_yP_{1-y}$ with a slightly larger lattice constant could also be used for the same bandgap and still be able to accommodate a transparent lattice constant transition layer 90.

As shown by lines 12, 93 in FIG. 10, the ternary $Ga_xIn_{1-x}As$ with its lattice constant of 5.972 Å requires the lattice constant transition layer 90 to make the transition between the lattice constant of the InP substrate (line 12) to the 5.972 Å lattice constant (line 93). As also illustrated in FIG. 10, increasing the proportion of As in an $InAs_yP_{1-y}$ lattice constant transition layer 90 reaches this 5.972 Å constant without its bandgap ever decreasing below about 0.82 eV (line 94), which is still higher than the 0.74 eV bandgap (line 14) of the first subcell 82. Therefore, any infrared radiation R that is not absorbed by, thus passes through, the first subcell 82 will also not be absorbed by the $InAs_yP_{1-y}$ in the lattice constant transition layer 90. Consequently, such infrared radiation will reach the second subcell 86, where at least some of it can be absorbed and converted to electricity.

If the substrate 84 is doped with a deep acceptor element, such as Fe or Cr, to be an insulator or semi-insulator, as explained above, then the first subcell 82 and the second subcell 86 are electrically isolated from each other. Therefore, electricity has to be extracted independently from each subcell 82, 86, as described above for the electrically isolated subcells 22, 24 of the PV converter device 110 in FIG. 4. This feature has advantages, such as in voltage-matching of multiple, series and/or parallel interconnected PV converter subcell circuits, especially in monolithic, integrated module (MIM) devices, as will be described in more detail below. In situations where the substrate 86 cannot be made as an insulator or semi-insulator, a separate isolation layer (not shown in FIG. 9) can be positioned anyplace between the two subcells 82, 86. For example, an isolation layer can be grown on either the front surface 83 or back surface 85 of the substrate 84 or between the lattice constant transition layer 90 and the second subcell 86. Such an isolation layer can be made as desired above in relation to the isolation layer 39 in FIG. 4, i.e., a lattice-matched material that is transparent to wavelengths of radiation not absorbed by the first subcell 82 and doped to make the material highly-resistive or to create a diode barrier to the flow of electric current. Of course, there could also be applications that involve a series connection of subcell 82 on the front side of the substrate 84 with the subcell 86 on the back side of the substrate 84, in which case the substrate 84 should be doped to conduct current, and appropriate tunnel junction layers may be added to allow current flow as explained above in relation to the PV converter device 10 of FIG. 2.

Figure 11:
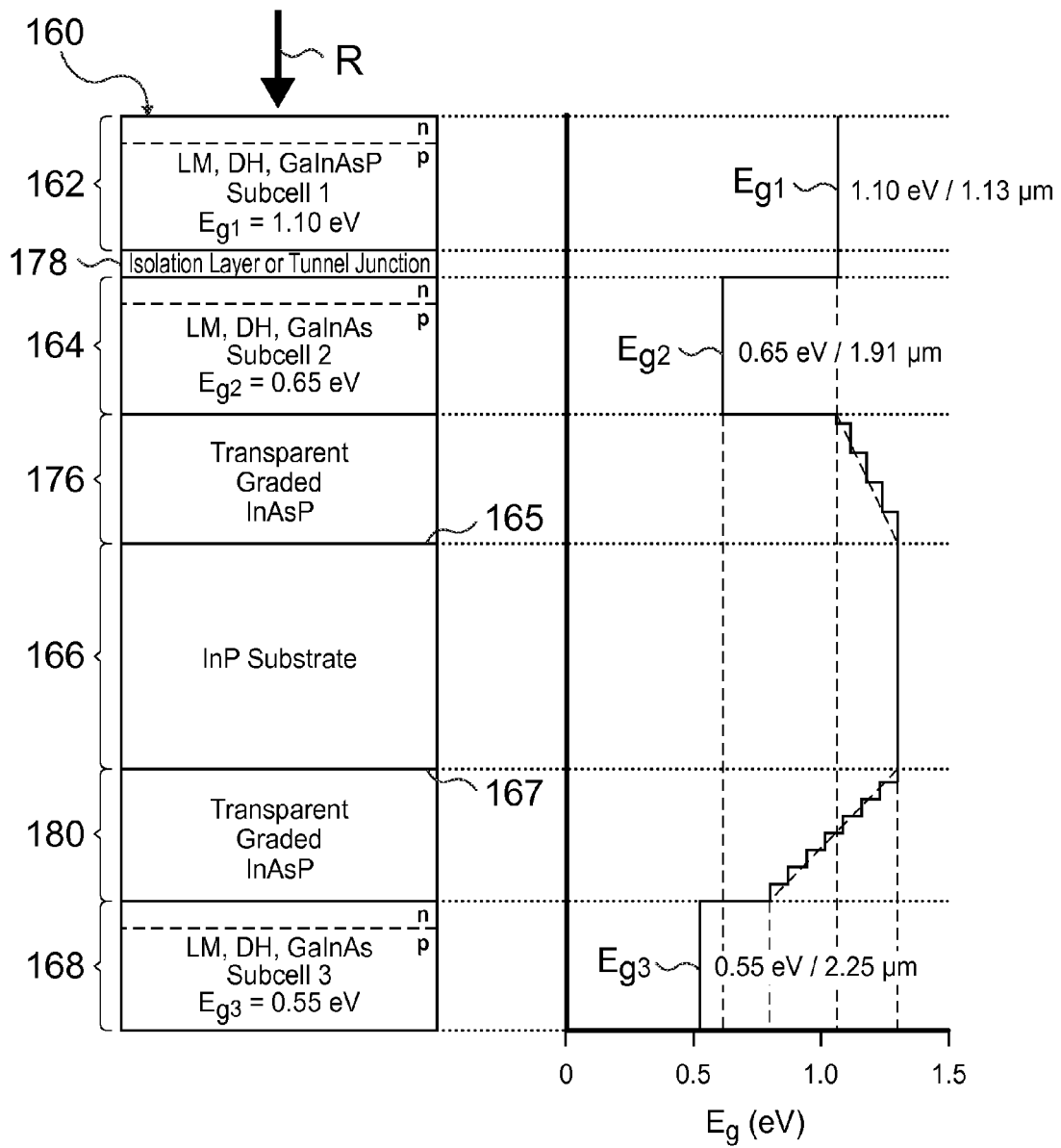
FIG. 11 is an illustration of a more complex, bifacial, monolithic, multi-bandgap, photovoltaic device.

As explained above, any of a wide range of ternary or quaternary GaInAs(P) alloys with any combinations of bandgaps and lattice constants can be used in subcells of tandem (more than one subcell) stacks of low-bandgap, monolithic, multi-bandgap, optoelectronic devices. Another example of such combinations is illustrated in the alternate example bifacial PV converter device 160 in FIG. 11, where two lattice mismatched (LMM) subcells 162, 164 are grown on the front side 165 of an InP substrate 166 and another, even lower bandgap, subcell 168 is grown on the back side 167 of the substrate 166. For purposes of this illustration, but not for limitation, the first subcell 162 is shown as LM, DH, quaternary $Ga_xIn_{1-x}As_yP_{1-y}$ with a bandgap of 1.1 eV, but lattice-matched to a LM, DH, ternary $Ga_xIn_{1-x}As$ second subcell 164 instead of to the InP substrate 166, as shown by lines 170, 172, 174 in FIG. 10. Therefore, a lattice constant transition layer 176, such as graded $InAs_yP_{1-y}$ is needed between the InP substrate 166 and the second subcell 164, as shown in FIG. 11, to make the transition between the 5.869 Å lattice constant of the InP substrate 166 (line 12 in FIG. 10) and the 5.905 Å lattice constant of the ternary $Ga_xIn_{1-x}As$ of the second subcell 164 (line 174 in FIG. 10). Either an isolation layer 178, as shown in FIG. 11, or a tunnel junction, can be positioned between the first subcell 162 and the second subcell 164, depending on whether it is desired to connect the subcells 162, 164 independently or in series, as explained above.

The third subcell 168 in the PV converter 160 in FIG. 11 has an even lower bandgap, for example 0.55 eV, to absorb and convert longer wavelength radiation transmitted through the first and second subcells 162, 164 to electricity, according to the principles explained above. Such a third subcell 168 can be, for example, a LM, DH, ternary $Ga_xIn_{1-x}As$ with a 0.55 eV bandgap, which is not lattice-matched to the InP substrate 166, as shown by lines 12, 93 in FIG. 10. Therefore, another lattice constant transition layer 180, such as graded $InAs_yP_{1-y}$ is needed between the InP substrate 166 and the third subcell 168 to make the transition between the 5.869 Å lattice constant of InP (line 12 in FIG. 10) and the 5.952 Å lattice constant of the ternary $Ga_xIn_{1-x}As$ (line 93 in FIG. 10) of the third subcell 168.

Again, if the InP substrate 166 is deep acceptor doped to be an insulator or semi-insulator, the third subcell 168 will be electrically isolated from the first and second subcells 162, 164 and can be connected independently to other PV converters or subcells, such as in a MIM structure (described below). Otherwise, a separate isolation layer (not shown in FIG. 11) may be needed somewhere between the substrate 166 and the third subcell 168, as explained above. Again, contacts, conductive layers, buffers, optical control layers, and the like, are not shown in FIG. 11, but can be provided as explained above for other embodiments.

Another interesting variation of the bifacial embodiment PV converter 80 in FIG. 9 is the use of epitaxially grown InP for the higher bandgap first subcell 82 instead of a ternary or quaternary GaInAs(P). This variation, with an appropriate lower bandgap (lower than the 1.35 eV bandgap of InP) second subcell 86, can operate as a highly efficient, stand-alone, tandem solar cell. This bifacial or buried substrate configuration of the PV converter 80 is particularly advantageous for use as a solar cell, because the buried InP substrate 84 is not in a position to block or absorb shorter wavelength solar radiation before it reaches the first subcell 82.

Figure 12:
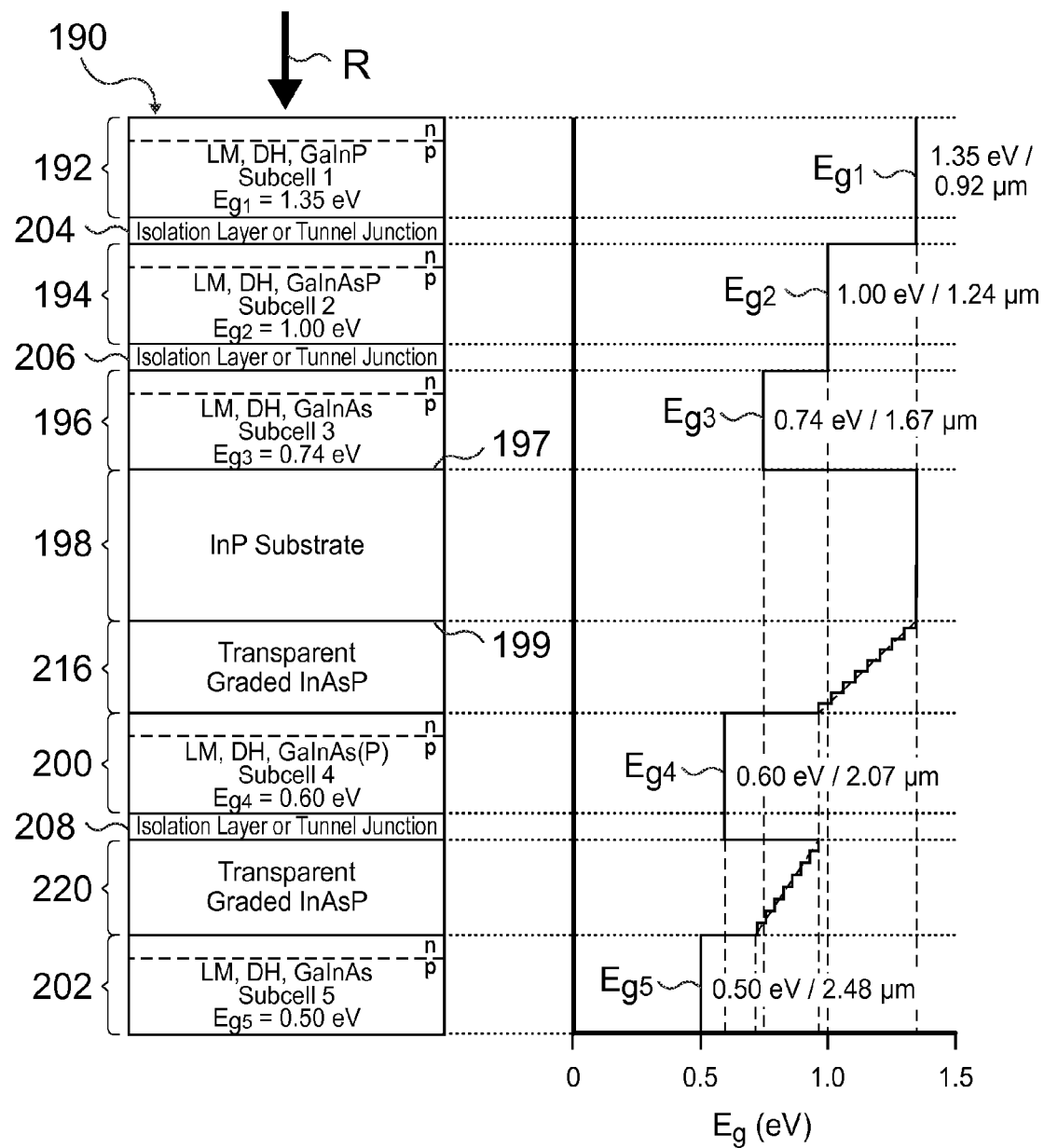
FIG. 12 is an illustration of another more complex, bifacial, monolithic, multi-bandgap, photovoltaic device that is particularly useful for solar photovoltaic (SPV) converter applications.

An illustration of this principle in a slightly more complex bifacial, monolithic, multi-bandgap, solar photovoltaic (SPV) converter device 190, multiples of which can also be incorporated into a MIM structure, is shown in FIG. 12. In this example SPV device 190, there are three lattice-matched subcells 192, 194, 196 grown on the front side 197 of a InP substrate 198 and two, lower bandgap, lattice-mismatched (LMM) subcells 200, 202 grown on the back side 199 of the substrate 198. Again, isolation and/or tunnel junction layers 204, 206 can be included between front-side subcells 192, 194 and/or between subcells 194, 196, respectively, for either independent electrical connection or series electrical connection, respectively, within the SPV device 190, as explained above. Similarly, either an isolation layer 208 or a tunnel junction can be provided between the back-side subcells 200, 202, depending on whether it is desired to electrically connect them independently or in series within the SPV device 190.

Figure 13:
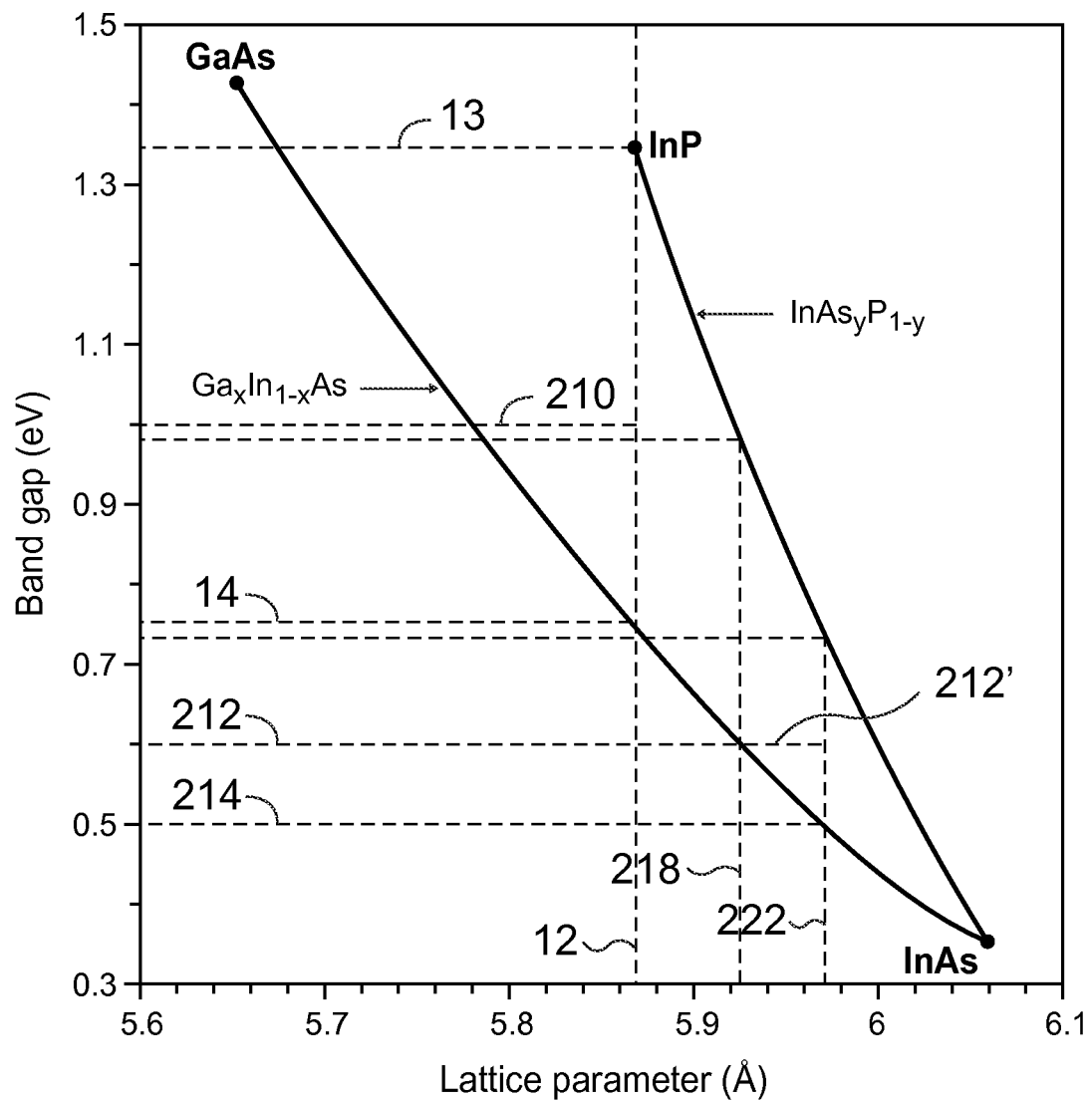
FIG. 13 is a bandgap versus lattice parameter chart showing bandgap and lattice constant parameters of the semiconductor materials used as examples in the embodiment of FIG. 12.

In the example SPV device 190, the first subcell 192 is shown as a LM, DH, InP subcell with a bandgap of 1.35 eV, while the bandgaps of the second and third subcells 194, 196 have lower bandgaps, e.g., 1.0 eV, LM, DH, quaternary $Ga_xIn_{1-x}As_yP_{1-y}$ for the second subcell 194 and 0.74 eV, LM, DH, ternary $Ga_{0.47}In_{0.53}As$ for the third subcell 196, which is the lowest bandgap GaInAs that can be lattice-matched to the InP substrate 198 (see lines 13, 14, 210 in FIG. 13). Since all the front-side subcells 192, 194, 196 are lattice-matched (line 12 in FIG. 13) to the InP substrate 198, no lattice constant transition layer is needed on the front side of the substrate 198.

Again, the variations of conductive or highly-resistive substrate 198, isolation and/or tunnel junction layers, electrical contacts, buffer layers, optical control layers, more or fewer subcells, different bandgaps, and the like, as described above for other embodiments, are also applicable to the SPV device 190 described above.

Also, AlInAs in slightly higher bandgaps than the 1.35 eV bandgap of the InP can also be lattice-matched to InP, so a first subcell of such AlInAs lattice-matched to the InP substrate could also be used as part of a bifacial, monolithic, multi-bandgap, PV converter. Of course, Ga could be added to produce AlGaInAs, if a slightly lower bandgap than AlInAs may be desired for either the first subcell or a subsequent subcell of a bifacial PV converter.

The PV converters described above can be used alone or in combinations with myriad other devices. For example, any of the PV converters, especially the SPV device 190, but also, PV converters 10, 110, 112, 140, 150, 80, 160, can be used for the bottom cell device in a mechanical stack of higher bandgap (higher than the 1.35 eV bandgap of InP) PV converters, such as GaAs based PV converters, in solar cell and other applications. Such other, higher bandgap, PV converters (not shown) can selectively absorb and convert shorter wavelength solar energy to electricity, while the lower bandgap PV converters, e.g., PV converters 10, 110, 112, 150, 80, 160, 190, absorb and convert longer wavelength solar radiation to electricity.

Figure 14:
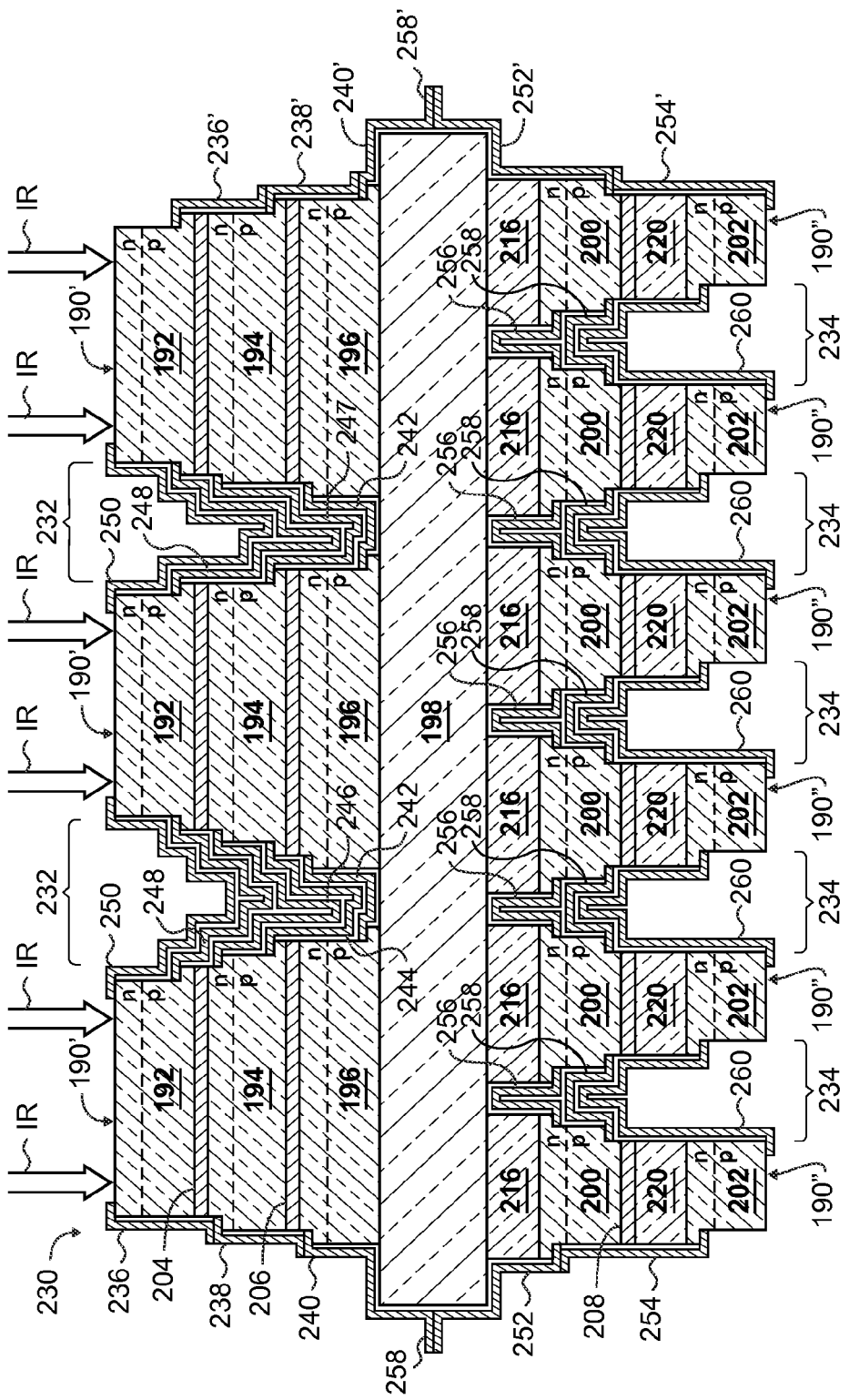
FIG. 14 is a cross-sectional view of a bifacial, monolithic integrated module (MIM)

As mentioned above, one or more of the bifacial, monolithic, multi-bandgap, optoelectronic devices described herein, for example, the bifacial PV converters 80, 160, 190 shown in FIGS. 9, 11, and 12 and described above, as well as myriad variations of such bifacial configurations, are particularly adaptable to use in monolithic, integrated modules (MIMs). An example MIM PV converter device 230 with a plurality of bifacial, monolithic, multi-bandgap, photovoltaic converters 190 of FIG. 12 grown on a single substrate 198 is shown in FIG. 14. Essentially, all of the PV converter subcell stacks 190 are grown in unison on the common substrate 198, and then they are separated into a plurality of individual subcell stacks 190' by etching away or otherwise removing material to form isolation trenches 232 between the front-side subcell stacks 190' and to form isolation trenches 234 between the back-side subcell stacks 190". Then, various conductors 236, 238, 240, 242, 244, 246, 248, 250, 252, 254, 256, 258, 260, and others are added in various electrical connection patterns to interconnect the subcells together, as will be described in more detail below. The spaces between the conductors are filled with insulator material, such as silicon nitride or any of a variety of other suitable insulator materials.

In the bifacial MIM PV converter device 230 illustrated in FIG. 14, there are twice as many, albeit smaller, back-side subcell stacks 190" as front-face subcell stacks 190'. Further, there can be any desired ratio of back-side subcell stacks 190" to front-side subcell stacks 190'. The ratio of two back-side subcell stacks 190" to one front-side subcell stack 190' shown in FIG. 14 is only an example.

Figure 15:
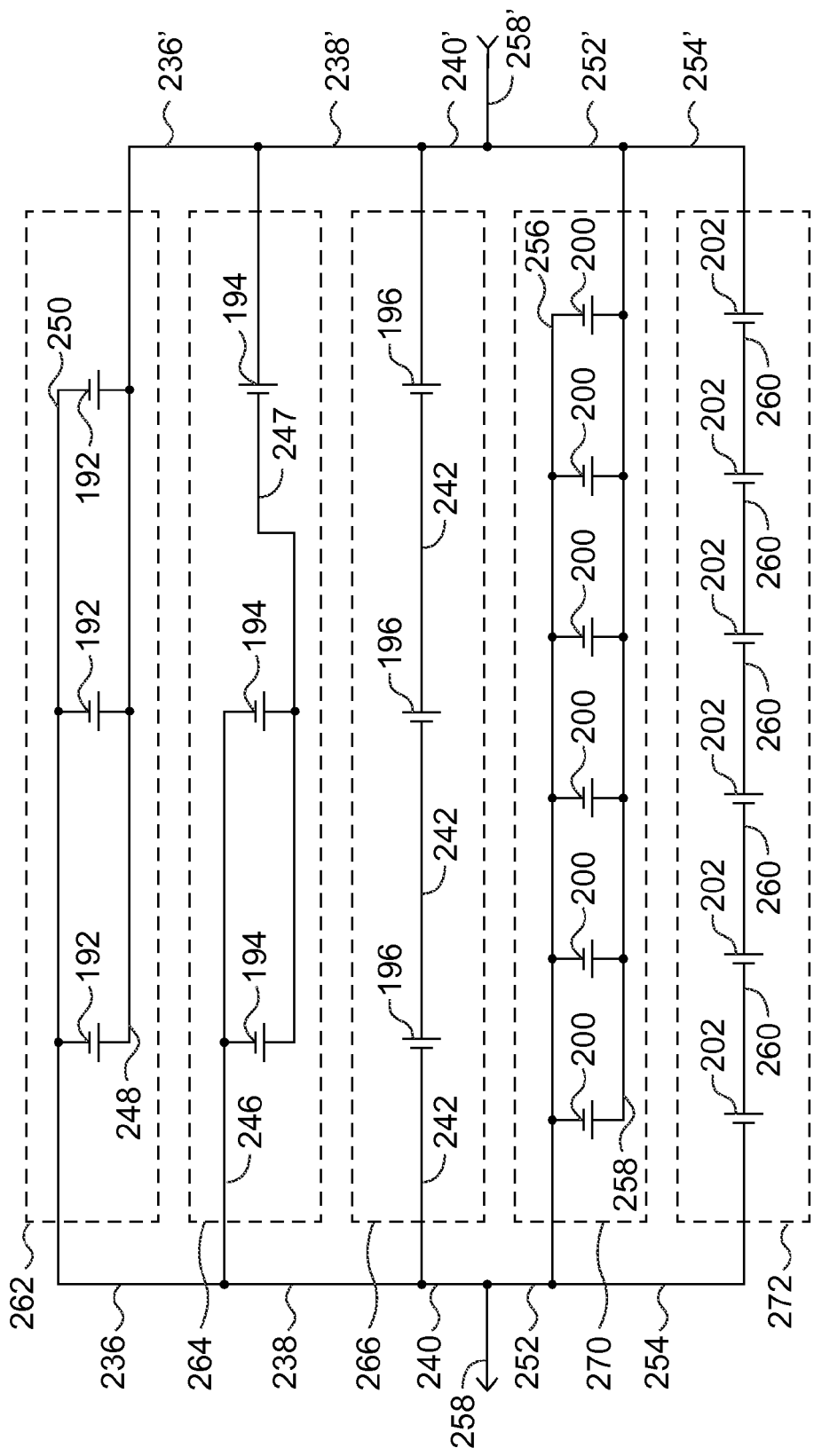
FIG. 15 is a schematic diagram of an equivalent electric circuit showing the voltage-matched electric subcell circuits of the bifacial MIM in FIG. 14.

One advantage of being able to have different numbers of subcell stacks 190', 190" on front and back of the substrate 198 is more flexibility to design voltage-matched subcell circuits. A schematic diagram of an equivalent electrical circuit corresponding to the example voltage-matched subcell circuits 262, 264, 266, 270, 272 of the MIM 230 of FIG. 14 is shown in FIG. 15. according to fundamental electrical principles, a circuit comprising a plurality of subcells connected in parallel will have an output voltage equal to the subcell output voltage, but current from the parallel connected subcells add. Conversely, a circuit comprising a plurality of subcells connected in series will have a current output equal to the subcell output current, but the output voltages of the series connected subcells add. Therefore, connecting a plurality of higher voltage subcells together in parallel can build current as output voltage remains constant, while connecting a plurality of lower voltage subcells together in series can boost the voltage output of the subcell circuit to the level of the higher voltage subcell circuit. Also, higher bandgap subcells produce higher voltage than lower bandgap subcells. Therefore, if, for example, the voltage output of each of the lower bandgap subcell stacks 190" in FIG. 14 is half as much as the voltage output of each of the higher bandgap subcell stacks 190', and if all the higher bandgap subcell stacks 190' are connected in series with each other while all the lower bandgap subcell stacks 190" are connected in series with each other, then the total voltage output of the back-side subcell stacks 190" circuits 270, 272 would equal the total voltage output of the front-side subcell stacks 190' circuits 262, 264, 266, because there are twice as many low voltage subcell stacks 190" as there are higher voltage subcell stacks 190'.

However, the front-side subcells 192, 194, 196 of the front-side stacks 190' can be connected in myriad combinations of series and/or parallel electrical connections, as illustrated in FIGS. 14 and 15 to create voltage-matched subcell circuits 262, 264, 266. The same goes for the back-side subcells 200, 202 of the back-side stacks 190" to create voltage-matched subcell circuits 270, 272. Such electrical connection options are facilitated by the isolation layers 204, 206, 208 and highly-resistive substrate 198, as described above. Additional options can be provided by tunnel junctions instead of isolation layers or even making the substrate 198 conductive rather than resistive for intra-subcell stack series connections, as explained above.

Figure 16:
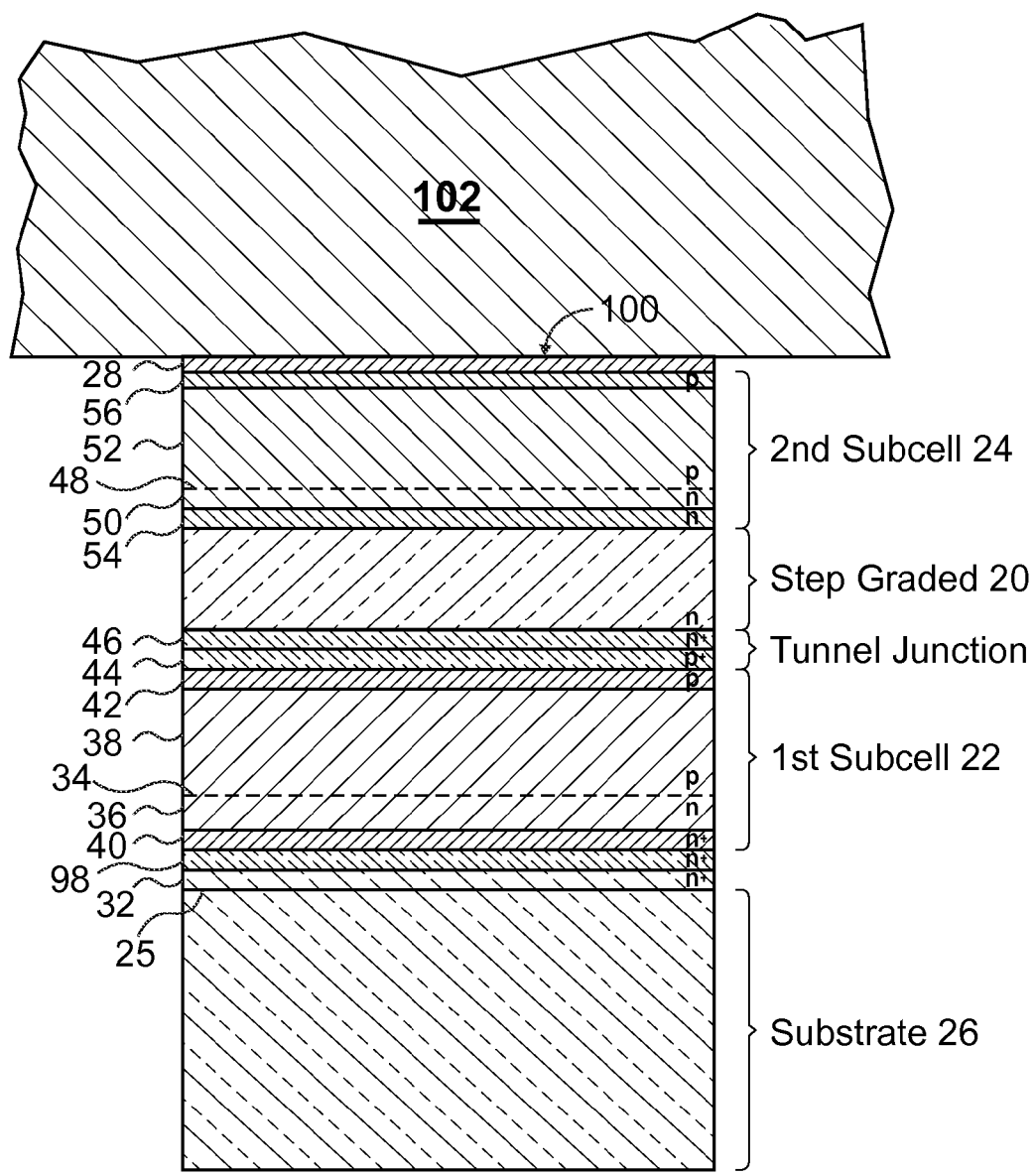
FIG. 16 is a diagrammatic illustration of a monolithic, multi-bandgap, photovoltaic device similar to FIG. 2, but with an added stop-etch layer and with the structure mounted on a panel, heat sink, printed circuit board, or other object.

To illustrate several series and parallel connection options, the bifacial MIM PV converter device 230 in FIGS. 14 and 16, is shown, for example, with all of its highest bandgap, thus highest voltage, subcells 192 connected together in parallel to form the subcell circuit 262. The next highest bandgap, thus next highest voltage, subcells 194 are connected together in a combination of parallel 244, 246 and series 247 connections to form a subcell circuit 264 that is voltage-matched to the subcell circuit 262. The subcells 196, which are the lowest bandgap, thus lowest voltage, of the subcells on the front side of the substrate 198, are shown in this example illustration of FIGS. 14 and 15, as all being connected in series in subcell circuit 266 by conductors 242 to add their voltages in order to match the output voltage of subcell circuit 266 to the output voltages of the subcell circuits 262, 264. These parallel and series-connected subcell circuits 262, 264, 266 are connected in parallel to each other at conductors 236, 238, 240 and at 236', 238', 240' to add their respective current outputs.

The back-side subcells 200, 202 are even lower voltage than the front-side subcells 196, but there are more of them than the front-side subcells 192, 194, 196, so the back-side voltage can be matched to the front-side voltage. In the example of FIGS. 14 and 15, the lowest voltage subcells 202 are connected together in series in the subcell circuit 272 by conductors 260 to add their voltages in order to match the output voltage of subcell circuit 272 to the output voltage of the parallel connected 256, 258, higher voltage subcells 200 in the subcell circuit 270. Then, the subcell circuit 272 is connected in parallel to the subcell circuit 270 by conductors 252, 254 and 252', 254' to add their respective current outputs.

Finally, the front-side subcell circuits 262, 264, 266 are connected in parallel to the back-side subcell circuits 270, 272 at terminal contacts 258, 258' to add their respective current outputs. Therefore, the bifacial MIM PV converter 230 can be connected electrically to other devices or loads via the two terminal contacts 256, 258, which may be a desirable feature. Other MIM structures, circuit connections, and advantages can be made according to these principles within this scope of embodiments. For example, but not for limitation, the monofacial, monolithic, LM, DH, multi-bandgap, PV converters described above can also be incorporated into MIM structures (not shown), although the bifacial embodiments described above have the advantage of using the substrate 198 as a built-in isolation structure between subcells on the front side and subcells on the back side, as explained above.

Any of the PV converter embodiments 10, 110, 150, described above and shown in FIGS. 1, 2, 4, and 6 can be modified to provide an ultra-thin, monolithic, multi-bandgap, PV converter by fabricating it in such a way as to enable removal of the InP substrate 26. For example, as shown in FIG. 16, a monolithic, multi-bandgap (tandem), PV converter 100 is fabricated much the same as the PV converter 10 in FIG. 2 on an InP substrate 26, except that a stop-etch layer 98 is added between the buffer layer 32 and the front cladding layer 40 of the first subcell 22. The stop-etch layer 98 can be, for example, n-$Ga_{0.47}In_{0.53}As$ with the same lattice constant as the InP substrate 26, so that the subsequent layers of the first and second subcells 22, 24, tunnel junction 44, 46, (or isolation layer for independently connected subcells) and lattice constant transition layer 20 can be grown epitaxially, as described above.

Figure 17:
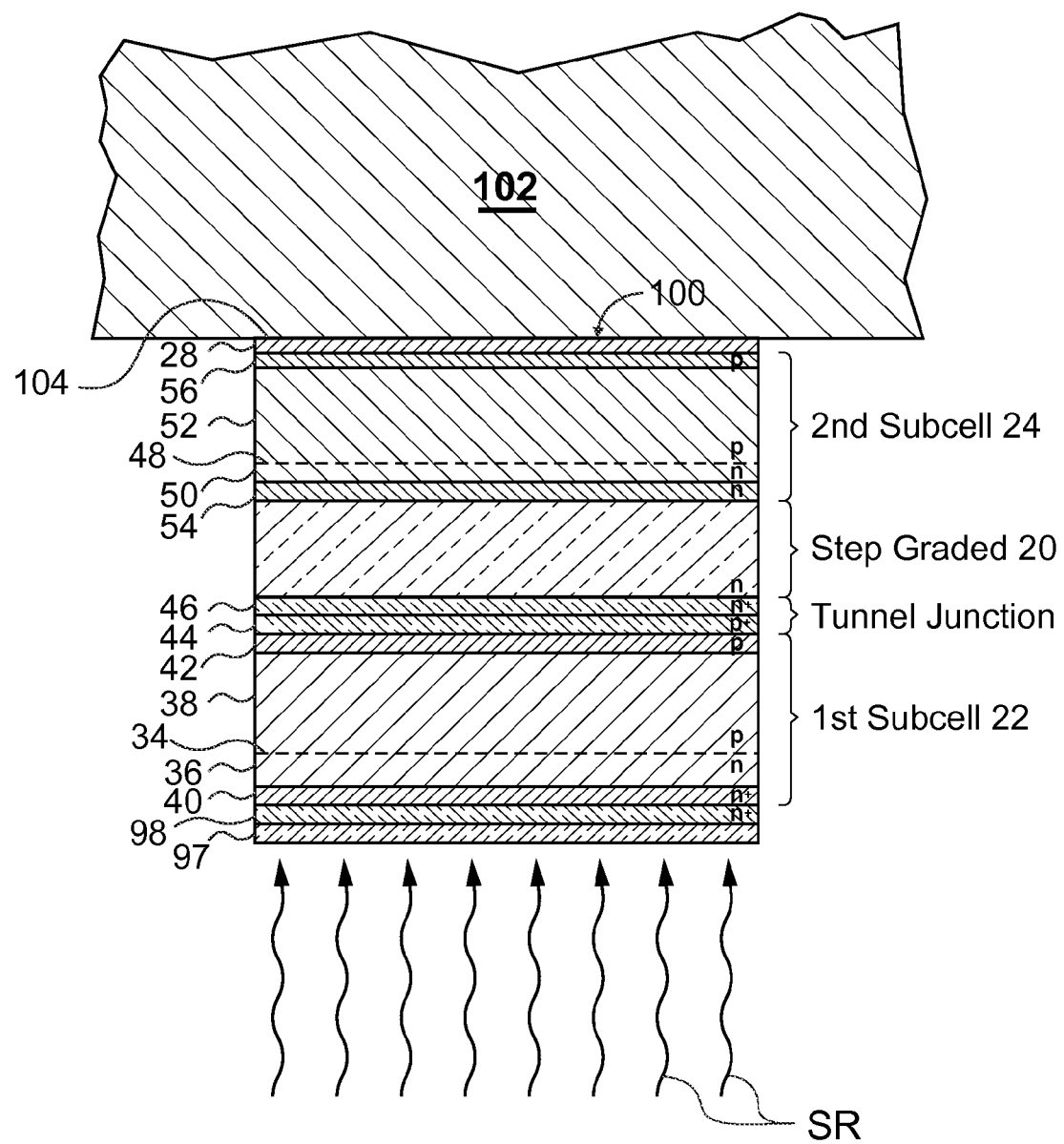
FIG. 17 is a diagrammatic view similar to FIG. 16, but with the substrate removed.

The purpose of the stop-etch layer 98 is to enable the InP substrate 26 and buffer layer 32 to be removed by etching or other selective chemical removal to create an ultra-thin, monolithic, multi-bandgap (tandem) PV converter 100 without etching or damaging any of the first subcell 22. After the several layers of the structure in FIG. 16 are grown epitaxially on the InP substrate 26, the structure 100 is top-mounted on another object 102, such as a solar panel, heat sink, printed circuit board, or other useful platform. Then the substrate 26 and buffer layer 32 are removed by etching or other selective chemical removal, leaving the ultra-thin, monolithic, multi-bandgap, PV converter 100 mounted on the object 102, as shown in FIG. 17. The stop-etch layer 98 can be an electrically conductive material, so it can also serve as a contact layer. If desired, part of such a conductive stop-etch layer 98 can be removed by etching or other selective chemical removal with a different chemical in which it is soluble to leave a grid pattern, which would be useful if the material of layer 98 is not transparent to the incident radiation R.

Mounting the PV converter 100 on the object 102 can be accomplished with a suitable adhesive or by any other suitable mounting mechanism. An anti-reflective coating 97 can be added to reduce reflection of incident radiation, or layer 97 can be any other optical control material for purposes described above for the PV converter 10.

This ultra-thin, monolithic, multi-bandgap, PV converter 100 enables this device to be used as a solar cell, because elimination of the InP substrate 26 allows all of the incident solar radiation SR to reach the subcells 22, 24, which can convert it to electricity. Otherwise, the InP substrate 26, which has a bandgap of 1.35 eV, would absorb large amounts of solar radiation SR in wavelengths shorter than 0.93 μm, before such solar radiation SR could reach the first subcell 22. There is no n/p junction in the substrate 22, and it cannot convert radiant energy to electricity, so any solar energy absorbed by the substrate 26 would be thermalized and wasted as heat.

Even without the InP substrate, however, there could be significant production of heat in the PV converter 100, when it is used as a solar cell, because there is a substantial amount of energy in higher frequencies (shorter wavelengths) of the solar spectrum, where wavelengths are substantially shorter than the longest wavelength that can be absorbed by the first subcell 22. Therefore, there is significant thermalization of excess energy that is not needed for carriers to transcend the bandgap $E_{g1}$ of the first subcell 22, thus a significant production of heat that should be dissipated from the PV converter 100. However, the PV converter 100 is ultra-thin and has no thick substrate, so heat can flow through the PV converter 100 is substantially one-dimensional, and it can flow quickly and easily to the back surface 104. If the object 102 on which the PV converter 100 is mounted is a good heat sink, i.e., good thermal conductivity and sufficient mass and/or surface area to conduct heat away from the PV converter 100, the combination provides very good thermal management and minimizes heat build-up in the PV converter 100.

The ultra-thin, monolithic, multi-bandgap, PV converter 100 can also be grown in a polycrystalline form on less expensive substrates, such as graphite, which is amorphous and does not impose a lattice constant on the first subcell 22, or in single-crystal form on compliant substrate or bonded substrate systems, which provide a lattice constant match to accommodate epitaxial growth. A typical compliant substrate may be made, for example, with an inexpensive substrate material, such as silicon, and with an amorphous oxide of the substrate material followed by a layer of perovskite oxide. Therefore, a first subcell 22 of InP, GaInAs, or GaInAsP will grow with its natural lattice constant. Such first subcell 22 can then be followed by a $InAs_yP_{1-y}$ lattice constant transition layer 20 and another, lower bandgap, second subcell 24, as described above. Then, the resulting ultra-thin PV converter 100 is mounted on another object 102 and the compliant substrate is removed.

Compliant substrates can also be used on any of the monofacial PV converter embodiments 10, 110, 112, 140, 150 described above, and they can possibly be used for the bifacial embodiments 80, 160, 190, 230. Possible uses of compliant substrates in one or more embodiments described herein depend on the transparency and other properties of the compliant substrate materials and systems being considered and/or applied.

While the description of this provided in this disclosure has focused primarily on photovoltaic converters, persons skilled in the art know that other optoelectronic devices, such as photodetectors and light-emitting diodes (LEDs) are very similar in structure, physics, and materials to PV converters with some minor variations in doping and the like. For example, photodetectors can be the same materials and structures as the PV converters described above, but perhaps more lightly-doped for sensitivity rather than power production. On the other hand LED's can also be much the same structures and materials, but perhaps more heavily-doped to shorten recombination time, thus radiative lifetime to produce light instead of power. Therefore, embodiments also apply to photodetectors and LEDs with structures, apparatus, compositions of matter, articles of manufacture, and improvements as described above for PV converters.

Since these and numerous other modifications and combinations of the above-described method and embodiments will readily occur to those skilled in the art, it is not desired to limit embodiments to the exact construction and process shown and described above. For example, accordingly, resort may be made to all suitable modifications and equivalents that fall within the scope of the disclosure as defined by the claims which follow. The words "comprise," "comprises," "comprising," "include," "including," and "includes" when used in this specification and in the following claims are intended to specify the presence of stated features or steps, but they do not preclude the presence or addition of one or more other features, steps, or groups thereof. Also, GaInAs(P) is used as a shorthand, generic term that includes any ternary $Ga_xIn_{1-x}As$ and/or quaternary $Ga_xIn_{1-x}As_yP_{1-y}$, and similar notation conventions apply to AlGaInAs(P).

We claim:

1. A monolithic, multi-bandgap, photovoltaic converter, comprising:
   a first subcell comprising GaInAs(P) with a first bandgap and a first lattice constant;
   a second subcell comprising GaInAs(P) with a second bandgap and a second lattice constant, wherein the second bandgap is less than the first bandgap and the second lattice constant is greater than the first lattice constant, and further, wherein the second lattice constant is equal to a lattice constant of a $InAs_yP_{1-y}$ alloy with a bandgap greater than the first bandgap; and
   a lattice constant transition material positioned between the first subcell and the second subcell, said lattice constant transition material comprising $InAs_yP_{1-y}$ alloy with a lattice constant that changes gradually from the first lattice constant to the second lattice constant.

2. The monolithic, multi-bandgap, photovoltaic converter of claim 1, wherein the lattice constant transition material is grown epitaxially on the first subcell with a gradually increasing value for y.

3. The monolithic, multi-bandgap, photovoltaic converter of claim 1, wherein the second subcell is grown epitaxially on the lattice constant transition material.

4. The monolithic, multi-bandgap, photovoltaic converter of claim 1, wherein the first subcell is a lattice-matched, double-heterostructure, comprising homojunction layers of GaInAs(P) clad by $InAs_yP_{1-y}$ cladding layers wherein the $InAs_yP_{1-y}$ cladding has a value for y in a range of $0<y<1$, such the $InAs_yP_{1-y}$ cladding layers of the first subcell have a lattice constant equal to the first lattice constant.

5. The monolithic, multi-bandgap, photovoltaic converter of claim 4, wherein the second subcell is a lattice-matched, double-heterostructure comprising homojunction layers of GaInAs(P) clad by $InAs_yP_{1-y}$ cladding layers, wherein the $InAs_yP_{1-y}$ cladding has a value for y in a range of $0<y<1$, such that the $InAs_yP_{1-y}$ cladding layer of the second subcell have a lattice constant equal to the second lattice constant.

6. The monolithic, multi-bandgap, photovoltaic converter of claim 1, including a InP substrate, and wherein the first subcell is grown epitaxially on the InP substrate.

7. The monolithic, multi-bandgap, photovoltaic converter of claim 1, including a tunnel junction positioned between the first subcell and the second subcell.

8. The monolithic, multi-bandgap, photovoltaic converter of claim 7, wherein the tunnel junction is positioned between the first subcell and the lattice constant transition layer.

9. The monolithic, multi-bandgap, photovoltaic converter of claim 1, wherein the lattice constant of the lattice constant transition material is graded.

10. The monolithic, multi-bandgap, photovoltaic converter of claim 1, wherein the lattice constant of the lattice constant transition material changes in steps of multiple, discrete, increments.

11. The monolithic, multi-bandgap, photovoltaic converter of claim 1, wherein the first bandgap is 0.74 eV.

12. The monolithic, multi-bandgap, photovoltaic converter of claim 6, wherein the first subcell is grown epitaxially on a front surface of the InP substrate, the lattice constant transition layer is grown epitaxially on a back surface of the InP substrate, and the second subcell is grown epitaxially on the lattice constant transition layer.

13. The monolithic, multi-bandgap, photovoltaic converter of claim 12, wherein the InP substrate is doped with deep acceptor atoms to make the substrate more electrically insulating than InP, which is not doped with deep acceptor atoms.

14. The monolithic, multi-bandgap, photovoltaic converter of claim 1, including a InP substrate positioned between the first subcell and the second subcell.

15. The monolithic, multi-bandgap, photovoltaic converter of claim 14, wherein the InP substrate is positioned between the first subcell and the lattice constant transition material.

16. The monolithic, multi-bandgap, photovoltaic converter of claim 1, including an isolation layer positioned between the first subcell and the second subcell.

17. The monolithic, multi-bandgap, photovoltaic converter of claim 16, wherein the isolation layer is positioned between the first subcell and the lattice constant transition material.

18. The monolithic, multi-bandgap, photovoltaic converter of claim 16, including a InP substrate positioned between the first subcell and the second subcell.

19. The monolithic, multi-bandgap, photovoltaic converter of claim 18, wherein the InP substrate is positioned between the second subcell and the isolation layer.

20. The monolithic, multi-bandgap, photovoltaic converter of claim 18, wherein the InP substrate is positioned between the first subcell and the isolation layer.

21. The monolithic, multi-bandgap, photovoltaic converter of claim 14, including a first isolation layer positioned between the InP substrate and the first subcell, and including a second isolation layer positioned between the InP substrate and the second subcell.

22. A monolithic, multi-bandgap, photovoltaic converter, comprising:
   a InP substrate with a substrate lattice constant;
   a first subcell comprising GaInAs(P) with a first bandgap and a first lattice constant, wherein the first lattice constant is greater than the substrate lattice constant;
   a lattice constant transition material positioned between the InP substrate and the first subcell, said lattice constant transition material comprising $InAs_yP_{1-y}$ alloy with a lattice constant that changes from the substrate lattice constant to the first lattice constant; and
   a second subcell comprising GaInAs(P) positioned behind the first subcell, said GaInAs(P) of the second cell having a second bandgap, which is less than the first bandgap, and a second lattice constant.

23. The monolithic, multi-bandgap, photovoltaic converter of claim 22, wherein the second lattice second lattice constant is equal to the first lattice constant.

* * * * *